(12) United States Patent
Takamine

(10) Patent No.: US 6,606,016 B2
(45) Date of Patent: Aug. 12, 2003

(54) SURFACE ACOUSTIC WAVE DEVICE USING TWO PARALLEL CONNECTED FILTERS WITH DIFFERENT PASSBANDS

(75) Inventor: Yuichi Takamine, Kanazawa (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

(21) Appl. No.: 09/799,387

(22) Filed: Mar. 5, 2001

(65) Prior Publication Data
US 2001/0028286 A1 Oct. 11, 2001

(30) Foreign Application Priority Data

Mar. 10, 2000 (JP) ........................................ 2000-066997
Nov. 30, 2000 (JP) ........................................ 2000-365801

(51) Int. Cl.$^7$ ............................. H03H 9/64; H03H 9/72
(52) U.S. Cl. ........................ 333/133; 333/193; 333/195
(58) Field of Search .......................... 333/133, 193–196

(56) References Cited

U.S. PATENT DOCUMENTS

| 5,521,453 | A | * | 5/1996 | Yatsuda ................... 333/193 X |
| 5,874,869 | A | * | 2/1999 | Ueda et al. ............. 333/195 X |
| 5,936,483 | A | * | 8/1999 | Ikada .......................... 333/133 |
| 6,057,744 | A | | 5/2000 | Ikada .......................... 333/133 |
| 6,115,592 | A | * | 9/2000 | Ueda et al. ................. 455/307 |
| 6,147,571 | A | * | 11/2000 | Kitazawa et al. ........... 333/126 |
| 6,339,704 | B1 | * | 1/2002 | Furukawa ............... 333/193 X |

FOREIGN PATENT DOCUMENTS

| EP | 0 871 288 | * | 10/1998 |
| JP | 5-327403 A | | 12/1993 |
| JP | 7-066679 | | 3/1995 |
| JP | 9-121138 | | 5/1997 |
| JP | 9-162695 A | | 6/1997 |
| JP | 9-181565 | * | 7/1997 |
| JP | 9-252232 A | | 9/1997 |
| JP | 9-284093 | | 10/1997 |
| JP | 10-215146 | | 8/1998 |
| JP | 2000-22495 | * | 1/2000 |
| JP | 2000-59176 | * | 2/2000 |
| JP | 2000-68781 | | 3/2000 |
| JP | 2000-349589 | * | 12/2000 |

* cited by examiner

Primary Examiner—Barbara Summons
(74) Attorney, Agent, or Firm—Keating & Bennett, LLP

(57) ABSTRACT

A surface acoustic wave device includes a first surface acoustic wave filter connected between an input terminal and an output terminal, a second surface acoustic wave filter having a different center frequency from that of the first surface acoustic wave filter, and which is connected between the input terminal and the output terminal and in parallel with the first surface acoustic wave filter, and at least one one-port surface acoustic wave resonator connected in series with the first or second surface acoustic wave filter, on at least one side between the input terminal and at least one of the first and second surface acoustic wave filters, or between the output terminal and at least one of the first and second surface acoustic wave filters. The anti-resonance frequency of the one one-port surface acoustic wave resonator is positioned on the side of higher frequencies than those of the pass band of the surface acoustic wave filter disposed on the side where the one-port surface acoustic wave resonator is connected in series.

32 Claims, 17 Drawing Sheets

SURFACE ACOUSTIC WAVE DEVICE USING TWO PARALLEL CONNECTED FILTERS WITH DIFFERENT PASSBANDS

BACKGROUND OF THE INVENTION

1. Field of the Invention

The present invention relates to a surface acoustic wave device for use as a band-pass filter, and more particularly, to a surface acoustic wave device including a plurality of band-pass filters.

2. Description of the Related Art

In recent years, multiband-capable portable telephones which include a plurality of communication systems have been developed. Furthermore, with the increase in the number of subscribers, portable telephones using a plurality of frequency bands such as the 800 MHz band of the Japanese PDC have also been developed.

These portable telephones are required for wide-band interstage band-pass filters in order to cover a plurality of frequency bands.

Moreover, in recent portable telephones, systems in which the transmission-side frequency band and the reception-side frequency band are close to each other increase in the number, and hence it is necessary to increase the steepness of the filter characteristics in the immediate vicinity of a desired pass band.

Japanese Unexamined Patent Application Publication No. 9-121138 discloses an example of a filter device capable of covering a plurality of pass bands. FIG. 17 is a circuit diagram for explaining the filter device according to this conventional art. Herein, the input terminal and the output terminal of filter elements 101 and 102 each including a surface acoustic wave filter are each shared between these filter elements 101 and 102. Specifically, the input ends of the filter elements 101 and 102 are connected to the input terminal 103, and the output ends of the filter elements 101 and 102 are connected to the output terminal 104. By causing the input terminal and output terminal to be shared between the filter elements 101 and 102, a reduction in the size and weight of a radio-signal portion is achieved.

Transmission lines 105 and 106 are connected between the input terminal 103 and one filter element 101, and between the output terminal 104 and the one filter element 101, respectively. Also, a capacitor 107 is connected between the filter element 102 and the input terminal 103, and an inductance element 108 is connected between the connection point between the input terminal 103 and the capacitor 107 and the ground potential. Similarly, a capacitor 109 is connected between the output end of the filter element 102 and the output terminal 104, and an inductance element 110 is connected between the connection point between the capacitor 109 and the output terminal 104 and the ground potential.

That is, phase adjusting circuits including the transmission lines 105 and 106 are connected between the filter element 101 and the input terminal 103 and the output terminal 104, respectively. Also, phase adjusting circuits including the capacitor 107 and the inductance element 108, and phase adjusting circuits constituted of the capacitor 109 and the inductance element 110 are connected between the filter element 102 and the input terminal 103 and the output terminal 104, respectively.

By providing the above-described phase adjusting circuits, each of the filter elements 101 and 102 is brought into a high impedance state in the band where it is not required, whereby superior pass band characteristics are obtained.

In addition, in the filter device according to this conventional art, a structure in which the above-described capacitors 107 and 109 and inductance elements 108 and 110 are disposed inside or outside the package of the filter device, or a structure in which the above-described transmission lines 105 and 106 are disposed on the laminated portion of the package, is disclosed.

However, as described in the above-described conventional art, when capacitors and inductance elements are provided inside or outside the package of the filter device in order to form phase adjusting circuits, the package itself inevitably becomes large, or the mounting area when the filter device is mounted on a circuit board of a portable telephone or other device must become large.

Also, when the transmission lines are disposed on the laminated portion of the package, fine-adjustments of the impedance cannot be performed if another surface acoustic wave filter is mounted on the same package. This requires that an exclusive package for each filter to be mounted must be used.

SUMMARY OF THE INVENTION

In order to overcome the problems described above, preferred embodiments of the present invention provide a surface acoustic wave device including a plurality of surface acoustic wave filters having different center frequencies and sharing an input terminal and an output terminal therebetween, the plurality of surface acoustic wave filters being connected in parallel, which allows the number of inductance elements and capacitor elements provided inside or outside the package to be reduced, and which enables the mounting area when the device is mounted on a circuit board or other substrate to be decreased.

In accordance with a preferred embodiment of the present invention, a surface acoustic wave device includes a first surface acoustic wave filter connected between an input terminal and an output terminal, a second surface acoustic wave filter having a center frequency that is different from that of the first surface acoustic wave filter, and which is connected between the input terminal and the output terminal and in parallel with the first surface acoustic wave filter, and at least one one-port surface acoustic wave resonator connected in series with the first or second surface acoustic wave filter, on at least one side between the input terminal and at least one of the first and second surface acoustic wave filters, or between the output terminal and at least one of the first and second surface acoustic wave filters. In this surface acoustic wave device, the anti-resonance frequency of the one one-port surface acoustic wave resonator is positioned on the side of higher frequencies than those of the pass band of the surface acoustic wave filter disposed on the side where the one-port surface acoustic wave resonator is connected in series.

In accordance with a particular aspect of at least one preferred embodiment of the present invention, the center frequency of the second surface acoustic wave filter is higher than that of the first surface acoustic wave filter, and a first one-port surface acoustic wave resonator and a second one-port surface acoustic wave resonator are connected in series between the second surface acoustic wave filter and the input terminal, and between the second surface acoustic wave filter and the output terminal, respectively.

In accordance with another aspect of at least one preferred embodiment of the present invention, a plurality of the one-port surface acoustic wave resonators are connected in a multi-stage series connection.

In accordance with another particular aspect of at least one preferred embodiment of the present invention, at least two of the one-port surface acoustic wave resonators are connected in series, on at least one side between the first or second surface acoustic wave filter and the input terminal, or between the first or second surface acoustic wave filter and the output terminal, and the plurality of one-port surface acoustic wave resonators which are connected in series with each other, are arranged so as to differ, from each other, in the frequency determined by the pitch of the interdigital transducers (hereinafter referred to as a "IDTs") thereof.

In accordance with another aspect of various preferred embodiments of the present invention, each of the first and second surface acoustic wave filters includes a longitudinally-coupled surface acoustic wave filter having three IDTs disposed along the surface wave propagation direction.

In accordance with another particular aspect of at least one preferred embodiment of the present invention, in the first and second longitudinally-coupled surface acoustic wave filters each having three IDTs, the first and second longitudinally-coupled surface acoustic wave filters are connected in parallel with each other so that the IDTs on both sides in the surface wave propagation direction, of the first and second longitudinally-coupled surface acoustic wave filters share the input (output) terminal therebetween, and simultaneously so that the center IDTs of the first and second longitudinally-coupled type surface acoustic wave filters share the output (input) terminal therebetween.

In accordance with another aspect of various preferred embodiments of the present invention, in at least one one-port surface acoustic wave resonator of the above-described one-port surface acoustic wave resonators, IDTs are weighting via a thinning method or other suitable process.

In accordance with still another aspect of preferred embodiments of a surface acoustic wave device in accordance with the present invention, there is further provided an inductance element additionally connected in parallel with each of the input and output terminals.

Preferably, the inductance value of the inductance element additionally connected in parallel with the input terminal is arranged so as to differ from that of the inductance element additionally connected in parallel with the output terminal.

In accordance with a further particular aspect of various preferred embodiments of the present invention, the electrode film thickness of the first surface acoustic wave filter is arranged so as to differ from that of the second surface acoustic wave filter.

In accordance with a yet further particular aspect of various preferred embodiments of the present invention, the first surface acoustic wave filter and the second surface acoustic wave filter are connected in parallel with each other on a piezoelectric substrate.

In accordance with another particular aspect of various preferred embodiments of the present invention, the input terminal and/or the output terminal are arranged to be balanced-signal terminals.

A communication device in accordance with another preferred embodiment of the present invention is characterized in that it includes a surface acoustic wave device according to other preferred embodiments of the present invention, as a band-pass filter.

In accordance with another preferred embodiment of the present invention, the input terminal and the output terminal of the first and second surface acoustic wave filters having different center frequencies, are shared between these surface acoustic wave filters, and at least one one-port surface acoustic wave resonator is connected in series with the first or second surface acoustic wave filter, on at least one side between the input terminal and at least one of the first and second surface acoustic wave filters, or between the output terminal and at least one of the first and second surface acoustic wave filters. Hence, impedance matching can be easily achieved in the construction wherein the first and second surface acoustic wave filters are connected in parallel with each other.

Since the anti-resonance frequency of the above-described one-port surface acoustic wave resonator is preferably at a higher frequency than the frequencies of the pass band of the surface acoustic wave filter disposed on the side where the one-port surface acoustic wave resonator is connected in series, the attenuation value on the higher frequency side of the pass band of the surface acoustic wave filter disposed on the side where the one-port surface acoustic wave resonator is connected in series, can be increased.

In the conventional example, it is necessary to connect numerous elements for impedance matching to the external elements, whereas, in preferred embodiments in accordance with the present invention, the number of elements to be connected to external elements is greatly reduced, which allows the mounting area to be greatly reduced.

When a one-port surface acoustic wave resonator is connected between each of the first and second surface acoustic wave filters and the input terminal, resistance against power is greatly improved.

When a plurality of one-port surface acoustic wave resonators are connected in multi-stage series connection, resistance against power is even more improved.

When at least two one-port surface acoustic wave resonators are connected in series, on at least one side between the first or second surface acoustic wave filter and the input terminal, or between the first or second surface acoustic wave filter and the output terminal, and the plurality of one-port surface acoustic wave resonators which are connected in series with each other, differ in the frequency determined by the pitch of the IDT from each other, not only is the resistance against power greatly improved, but also the steepness on the side of higher frequencies than the frequencies of the pass band is improved and ripples occurring in the pass band are greatly reduced.

When IDTs are thinned out in at least one one-port surface acoustic wave resonator of the one-port surface acoustic wave resonators, the anti-resonance approaches the resonance frequency side, and thereby a higher attenuation value can be achieved at the vicinity of the higher frequency side of the pass band.

In preferred embodiments of the present invention, when each of the first and second surface acoustic wave filters includes longitudinally-coupled surface acoustic wave filters having three IDTs disposed along the surface wave propagation direction, the miniaturization of the first and second surface acoustic wave filters can be achieved by using the longitudinally-coupled surface acoustic wave filters.

In the construction wherein, in the first and second longitudinally-coupled type surface acoustic wave filters each having three IDTs, the first and second longitudinally-coupled surface acoustic wave filters are connected in parallel with each other so that the IDTs on both sides in the surface wave propagation direction, of the first and second longitudinally-coupled surface acoustic wave filters share the input (output) terminal therebetween, and simultaneously so that the center IDTs of the first and second longitudinally-coupled type surface acoustic wave filters share the output (input) terminal therebetween, the insertion loss in the pass band is even more reduced.

When an inductance element additionally connected in parallel with each of the input and output terminals is further provided, the impedance is matched more optimally by this inductance element.

When the inductance value of the inductance element additionally connected in parallel with the input terminal differs from that of the inductance element additionally connected in parallel with the output terminal, impedance matching can be optimized on each of the sides of the input terminal and the output terminal.

The electrode film thicknesses of the first and second surface acoustic wave filters may be substantially equal, but may instead be different from each other so as to be optimized depending on characteristics of each of the surface acoustic wave filters, which allows the degree of freedom of the ultimately achievable characteristics to be increased.

In the construction wherein the first surface acoustic wave filter and the second surface acoustic wave filter are connected in parallel with each other on a piezoelectric substrate, the miniaturization of the surface acoustic wave device in accordance with various preferred embodiments of the present invention can be achieved, and the simplification of the electrode design on the substrate and on the package side can be achieved.

For the purpose of illustrating the invention, there is shown in the drawings several forms which are presently preferred, it being understood, however, that the invention is not limited to the precise arrangements and instrumentalities shown.

Other features, elements, characteristics and advantages of preferred embodiments of the present invention will become more apparent from the detailed description of preferred embodiments thereof with reference to the attached drawings.

DETAILED DESCRIPTION OF PREFERRED EMBODIMENTS

Hereinafter, the present invention will be disclosed by describing the surface acoustic wave device in accordance with a plurality of preferred embodiments of the present invention with reference to the attached drawings.

Figure 1:
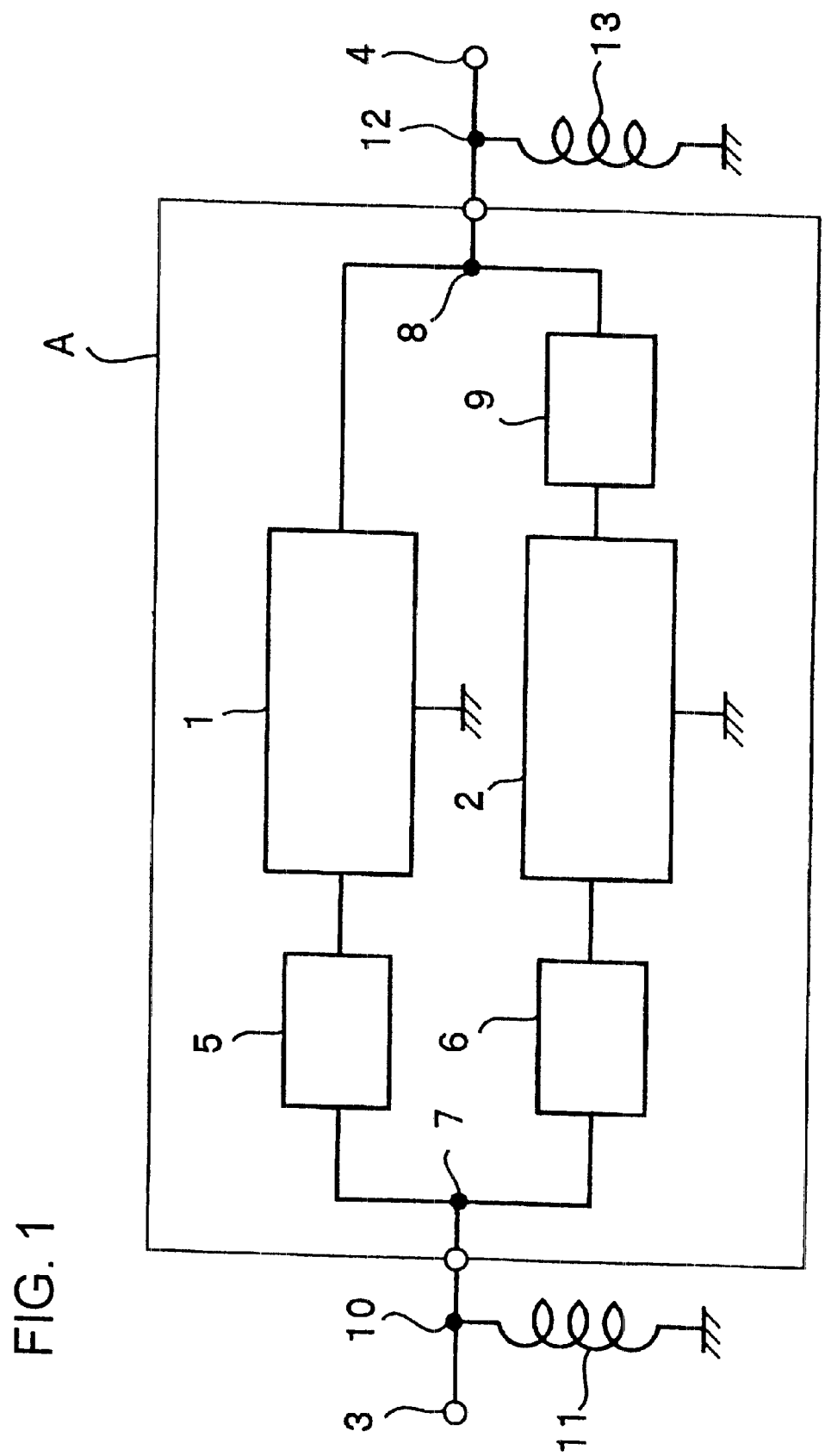
FIG. 1 is a diagram showing the circuit configuration of a surface acoustic wave device in accordance with a first preferred embodiment of the present invention.

FIG. 1 is a diagram showing the circuit configuration of a surface acoustic wave device in accordance with a preferred embodiment of the present invention.

The surface acoustic wave device in accordance with this preferred embodiment is a surface acoustic wave filter capable of operating in a plurality of reception-side frequency bands in the 800 MHz band of the Japanese PDC. In the 800 MHz band of the PDC, a reception-side frequency band of 810 to 843 MHz and that of 870 to 885 MHz are used.

As shown in FIG. 1, the input ends of the first and second surface acoustic wave filters 1 and 2 are connected to the input terminal 3 in common, thereby sharing the input terminal 3 therebetween. Similarly, the output ends of the first and second surface acoustic wave filters 1 and 2 are connected to the output terminal 4 in common, thereby sharing the output terminal 4 therebetween. In other words, the surface acoustic wave filters 1 and 2 are connected in parallel with each other between the input terminal 3 and the output terminal 4.

Figure 2:
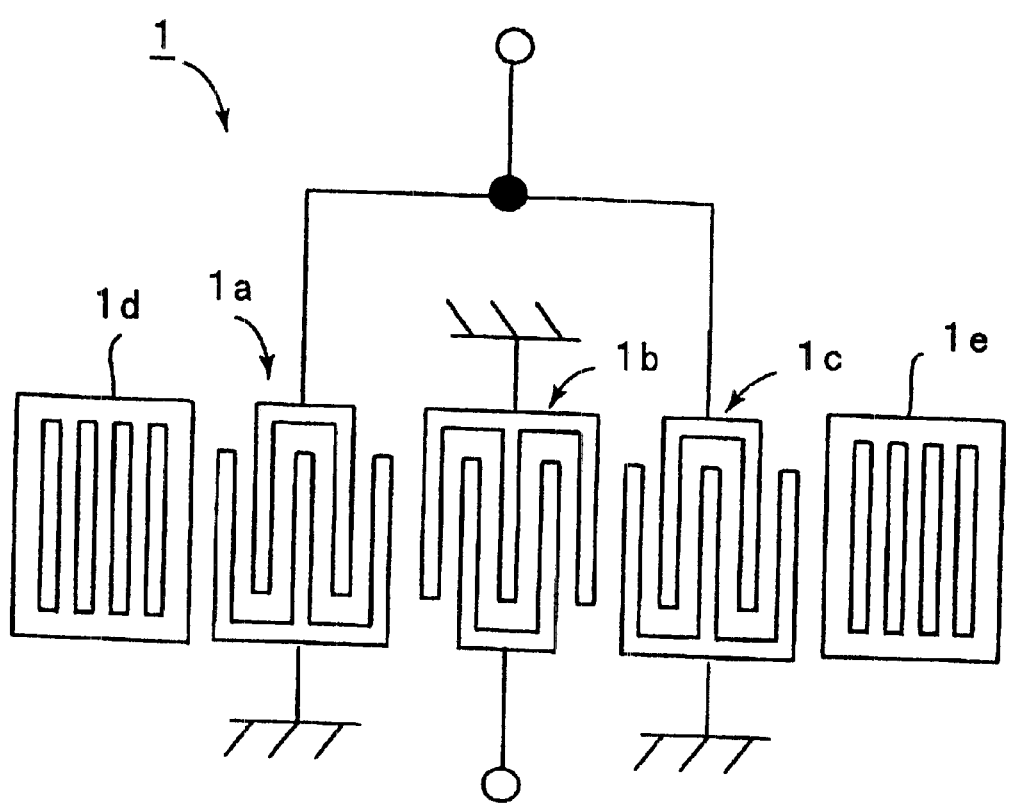
FIG. 2 is a schematic plan view for explaining the electrode structure the surface acoustic wave filter used in the first preferred embodiment of the present invention.

Each of the surface acoustic wave filters 1 and 2 preferably has a structure in which a plurality of IDTs are provided on a piezoelectric substrate. FIG. 2 is a schematic plan view showing the electrode structure of the surface acoustic wave filter 1.

For the surface acoustic wave filter 1, a 36 degree, Y-cut, and X-propagation LiTaO$_3$ substrate is preferably used in order to widen the band width. However, as a material for a piezoelectric substrate, another piezoelectric single-crystal or piezoelectric ceramic may instead be used.

On the top surface of the piezoelectric substrate, three IDTs 1a through 1c are preferably provided. Reflectors id and 1e are disposed outside the area where the IDTs 1a through 1c are provided. That is, the surface acoustic wave filter 1 has a one-stage longitudinally-coupled circuit configuration having three IDTs. However, the surface acoustic wave filter 1 may instead be constituted of a surface acoustic wave filter having another structure.

Descriptions have been made taking the surface acoustic wave filter 1 as an example, but the surface acoustic wave filter 2 is also constructed as in the case of the surface acoustic wave filter 1.

The first and second surface acoustic wave filters 1 and 2 are, however, arranged so as to have different center frequencies. Specifically, the center frequency of the surface acoustic wave filter 1 is preferably about 828.5 MHz so as to cover the 810 to 843 MHz band, while that of the surface acoustic wave filter 1 is preferably about 877.5 MHz so as to cover the 870 to 885 MHz band.

Between the input terminal 3 and the input end of the surface acoustic wave filter 1, a one-port surface acoustic wave resonator 5 is connected in series with the surface acoustic wave filter 1. Similarly, between the input terminal 3 and the surface acoustic wave filter 2, a one-port surface acoustic wave resonator 6 is connected in series with the surface acoustic wave filter 2. The one-port surface acoustic wave resonators 5 and 6 are connected to the input terminal 3 in common. That is, one-side ends of the one-port surface acoustic wave resonators 5 and 6 are connected to the connection point 7 connected to the input terminal 3.

On the other hand, between the connection point 8 to which the output ends of the surface acoustic wave filters 1 and 2 are connected in common and the output end of surface acoustic wave filter 2, a one-port surface acoustic wave resonator 9 is connected in series with the surface acoustic wave filter 2.

Each of the one-port surface acoustic wave resonators 5, 6, and 9 has a structure in which there are provided one IDT and reflectors disposed on both sides of the IDT in the surface acoustic wave propagation direction. Alternatively, each of the one-port surface acoustic wave resonators 5, 6, and 9 may have a structure without reflectors. In the one-port surface acoustic wave resonator, however, the structure in which reflectors are disposed on both sides of the IDT has a higher Q value. Thus, it is preferable to use a one-port surface acoustic wave resonator having reflectors as described above.

An inductance element 11 for matching an impedance is connected between the connection point 10 between the input terminal 3 and the connection point 7 and the ground potential. Similarly, an inductance element 13 for defining an impedance matching circuit is connected between the connection point 12 between the connection point 8 and the output terminal 4 and the ground potential. In this preferred embodiment, the inductance values of the inductance element 11 and the inductance element 13 are preferably about 10 nH and 12 nH, respectively. That is, the inductance elements 11 and 13 are arranged to have different inductance values from each other.

In FIG. 1, the solid line A schematically indicates the outer edge of a package. In the surface acoustic wave device in accordance with this preferred embodiment, all elements other than the inductance elements 11 and 13 are preferably provided on the same piezoelectric substrate in the package. However, the surface acoustic wave filters 1 and 2, and the one-port surface acoustic wave resonators 5, 6, and 9 may instead be disposed on different piezoelectric substrates, and a plurality of piezoelectric substrates may be disposed in the package.

Figure 3:
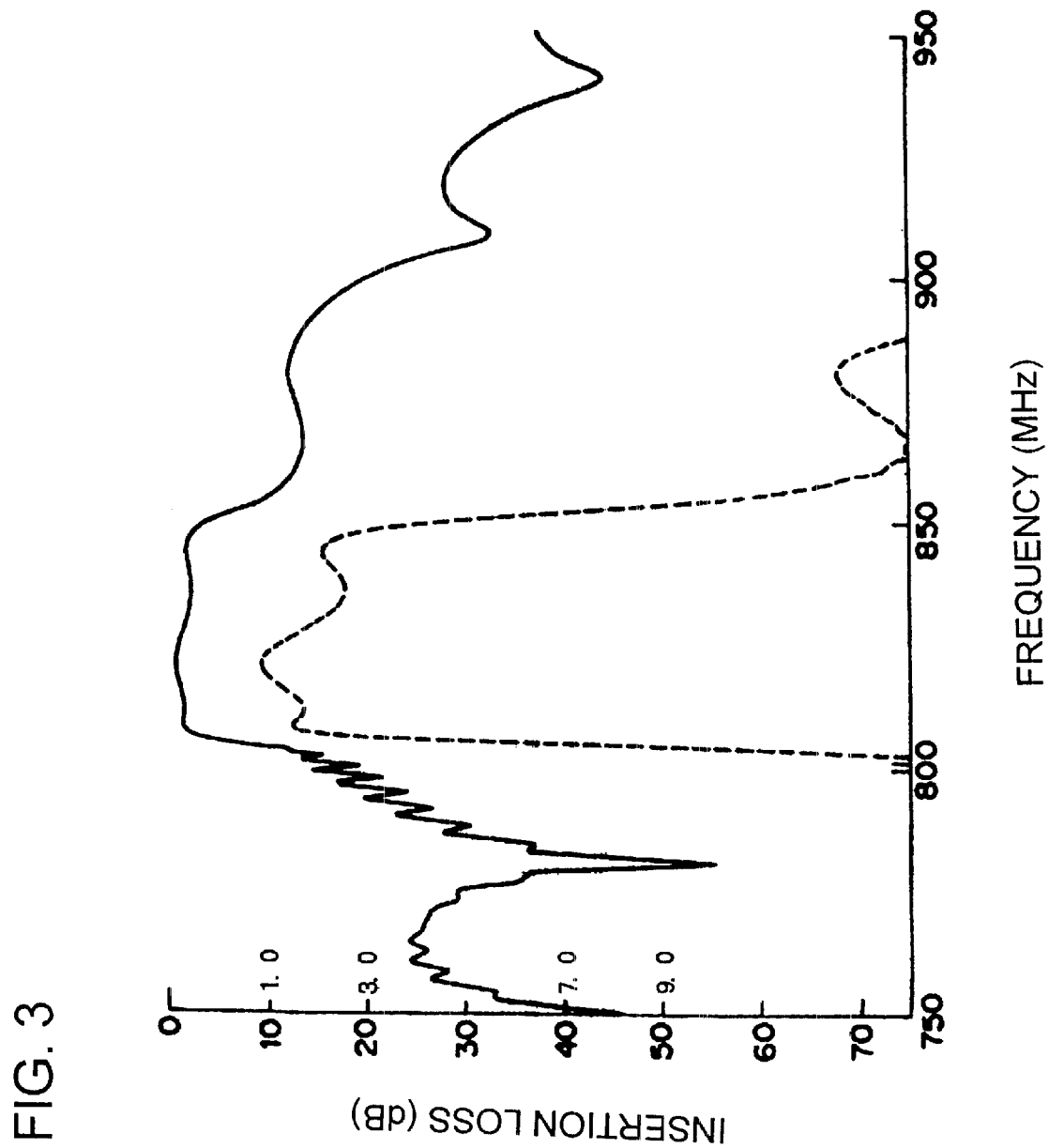
FIG. 3 is a diagram showing the frequency characteristics of the surface acoustic wave filter 1 used in the surface acoustic wave device in accordance with the first preferred embodiment.
Figure 4:
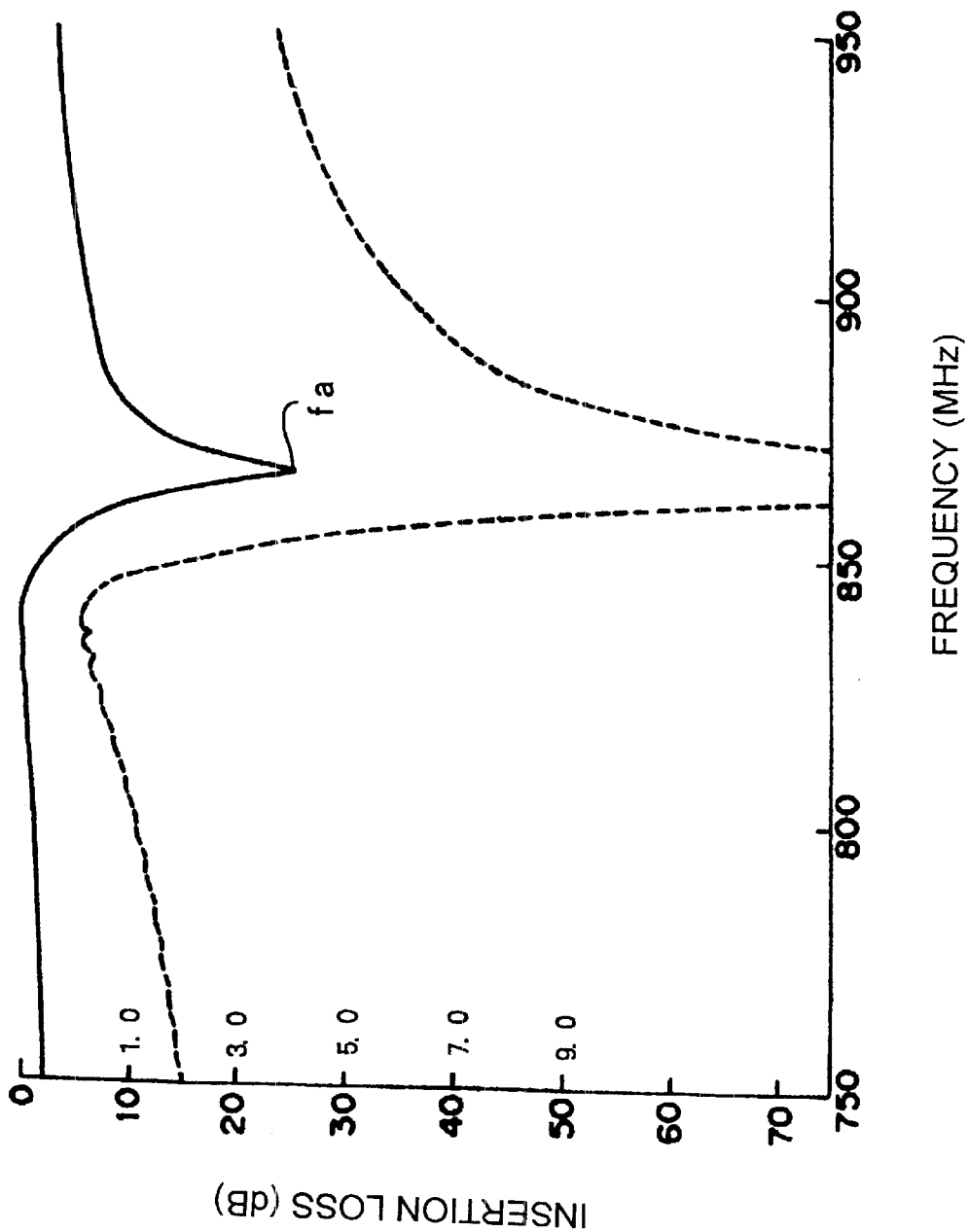
FIG. 4 is a diagram showing the frequency characteristics of the one-port surface acoustic wave resonator used in the surface acoustic wave device in accordance with the first preferred embodiment of the present invention.

FIG. 3 shows the frequency characteristics of the insertion-loss of the surface acoustic wave filter 1 used in the surface acoustic wave device in accordance with this preferred embodiment, and FIG. 4 shows the frequency characteristics of the insertion-loss of the one-port surface acoustic wave resonator 5 used in the surface acoustic wave device in accordance with this preferred embodiment. Herein, the frequency characteristics indicated by broken lines in FIGS. 3 and 4, as well as FIGS. 5, 7, 9, and 10 that will be shown later, are scaled-up characteristics which are obtained by enlarging frequency characteristics indicated by the solid line, on the scale on the right side of the vertical axis.

The specifications of the first and second surface acoustic wave filters and the first and second one-port surface acoustic wave resonators are shown in Table 1 below.

TABLE 1

| | Filter 1 | Filter 2 | Resonator 5 | Resonator 6 | Resonator 9 |
|---|---|---|---|---|---|
| Cross width (μm) | 270 | 320 | 50 | 64 | 64 |
| Number of IDT pairs | 9/14/9 | 10/17/10 | 100 | 50 | 100 |
| IDT wavelength (μm) | 4.74 | 4.52 | 4.69 | 4.40 | 4.40 |
| Reflector wavelength (μm) | 4.89 | 4.56 | 4.69 | 4.40 | 4.40 |
| IDT duty | 0.75 | 0.75 | 0.50 | 0.70 | 0.70 |
| Reflector duty | 0.55 | 0.55 | 0.50 | 0.70 | 0.70 |
| IDT-IDT gap | 1.28λ$_I$ | 0.33λ$_I$ | — | — | — |
| IDT-Reflector gap | 0.55λ$_R$ | 0.50λ$_R$ | 0.50λ$_R$ | 0.50λ$_R$ | 0.50λ$_R$ |
| Number of reflectors | 50 | 60 | 30 | 25 | 25 |
| Al-film thickness | 0.08λ$_I$ | 0.084λ$_I$ | 0.081λ$_I$ | 0.086λ$_I$ | 0.086λ$_I$ |

As shown in Table 1, the Al electrode film thickness is arranged so as to be about 8% of the wavelength at the IDT portion of the surface acoustic wave filter 1, that is, about 0.08 λ. In this preferred embodiment, the Al electrode film thicknesses of the surface acoustic wave filters 1 and 2 are preferably substantially same. However, in order to constitute the surface acoustic wave filters 1 and 2 of Al electrodes having the optimum film thickness, the Al electrode film thicknesses of the surface acoustic wave filters 1 and 2 may be arranged so as to differ from each other, whereby the degrees of freedom of characteristics are greatly increased.

The pass band of the surface acoustic wave filter 1 is 810 MHz to 843 MHz, while the anti-resonance frequency fa of the one-port surface acoustic wave resonator 5 is 866 MHz. That is, the anti-resonance frequency fa of the surface acoustic wave resonator 5 is preferably higher than the frequency at the end portion on the higher frequency side of the pass band of the surface acoustic wave filter 1 with which the surface acoustic wave resonator 5 is connected in series. Likewise, each of the anti-resonance frequencies of the one-port surface acoustic wave resonators 6 and 9 is 922 MHz, that is, it is preferably higher than the frequency at the end portion on the higher frequency side of the pass band of the surface acoustic wave filter 2 with which the one-port surface acoustic wave resonators 6 and 9 are connected.

In the 800 MHz band of the PDC, the transmission-side frequency bands lie in the 893 MHz to 898 MHz band and the 925 MHz to 960 MHz band. In a surface acoustic wave device for reception, therefore, it is required that the attenuation values in these transmission-side frequency bands be high.

In this preferred embodiment, the one-port surface acoustic wave resonators 6 and 9 are connected in series with the input-side and the output side of the surface acoustic wave filter 2 of which the center frequency is relatively high. By matching the anti-resonance frequencies of the one-port surface acoustic wave resonators 6 and 9 to the transmission-side frequency band, the attenuation value in the transmission-side frequency band is greatly increased.

Furthermore, by increasing the number of one-port surface acoustic wave resonators each connected in series between the input and output terminals 3 and 4 and the surface acoustic wave filter 2, the attenuation value is even more increased. For this purpose, in this preferred embodiment, two one-port surface acoustic wave resonators 6 and 9 are connected in series with the surface acoustic wave filter 2 having a relatively high center frequency, to achieve an impedance matching. Also, with such a construction, a high attenuation value can be achieved on the transmission-side frequency band.

The reason why the inductance elements 11 and 13 are arranged so as to have different inductance values is because the optimum inductance value has been selected for each of these inductance elements. The surface acoustic wave filters 1 and 2 are required for wide band filter characteristics. Typically, therefore, three-IDT or five-IDT type surface acoustic wave filters which are suitable for a wide-band design are frequently used. In these surface acoustic wave filters suitable for a wide-band design, the input-side impedance and the output-side impedance are different from each other. In order to optimize the impedance matching between the input side and the output side, it is preferable to use the inductance elements 11 and 13 having different inductance values from each other, as described above.

Figure 5:
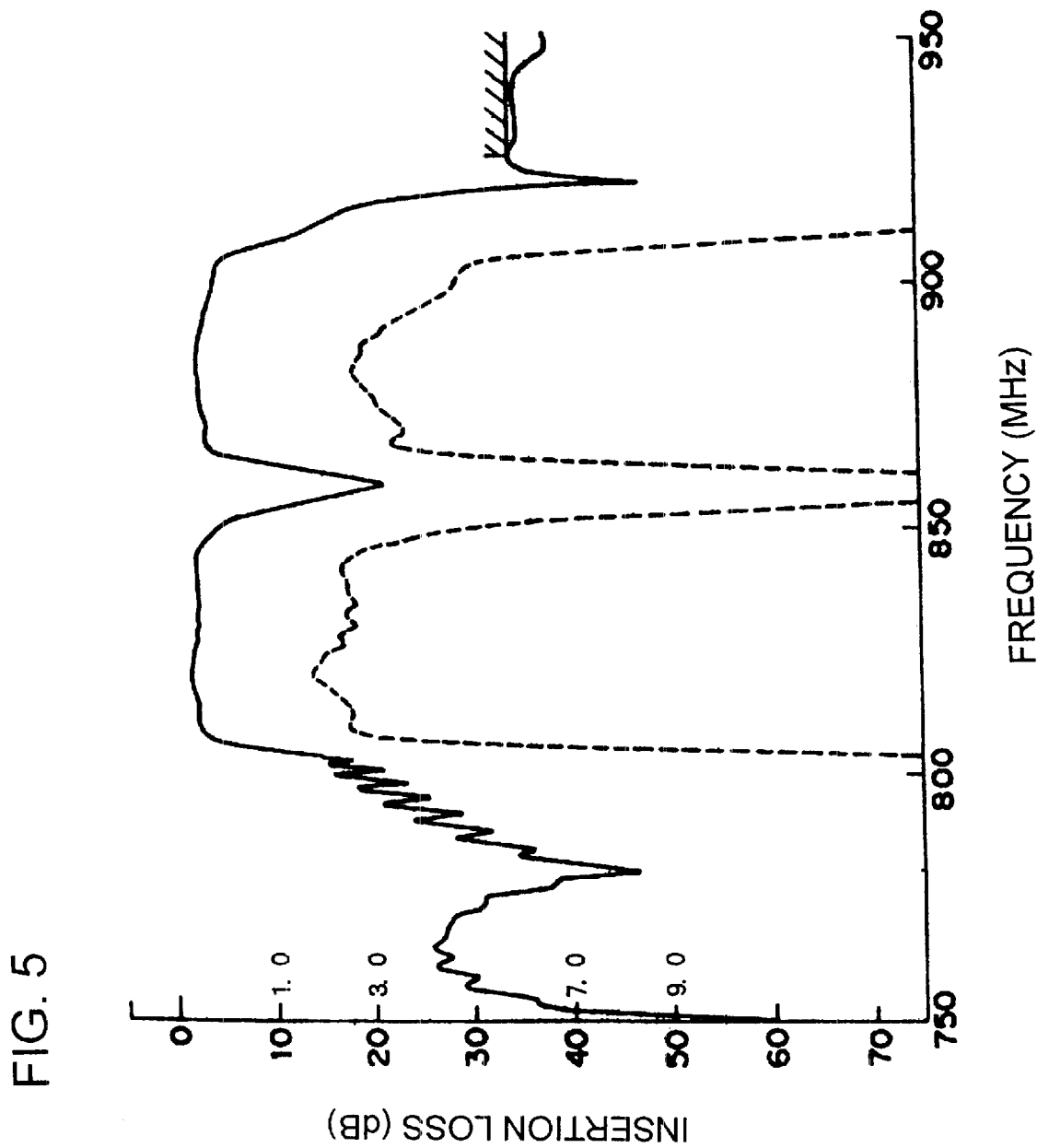
FIG. 5 is a diagram showing the frequency characteristics of the surface acoustic wave device in accordance with the first preferred embodiment of the present invention.
Figure 6:
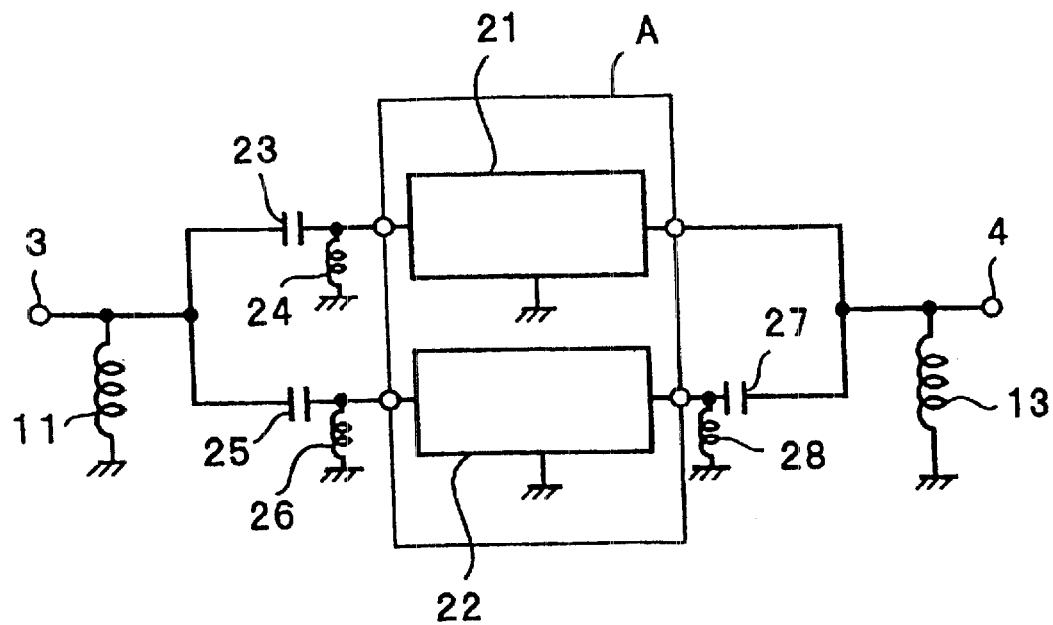
FIG. 6 is a diagram for explaining the circuit configuration of a conventional surface acoustic wave device prepared for comparison to preferred embodiments of the present invention.

FIG. 5 shows the frequency characteristics of the surface acoustic wave device in accordance with this preferred embodiment. For comparison, a surface acoustic wave device was prepared which has a structure wherein the impedance matching of the surface acoustic wave filters 1 and 2 was obtained only by inductance elements and capacitors. FIG. 6 shows the circuit configuration of this surface acoustic wave device. In FIG. 6, surface acoustic wave filters 21 and 22 were constructed similarly to the surface acoustic wave filters 1 and 2. In FIG. 6, an impedance matching circuit including a capacitor 23 and inductance element 24, and an impedance matching circuit including a capacitor 25 and inductance element 26, were disposed between the surface acoustic wave filters 21 and 22 and the input terminal 3, respectively. Also, an impedance matching circuit including a capacitor 27 and inductance element 28 was inserted between the surface acoustic wave filters 22 and the output terminal 4.

For other respects, these surface acoustic wave filters were constructed in the same manner as the surface acoustic wave filter 1 in accordance with the first preferred embodiment. A comparative example of surface acoustic wave device was thus produced.

In this comparative example of the surface acoustic wave device, the inductance values of the inductance elements 11, 13, 24, 26, and 28 are 10 nH, 10 nH, 15 nH, 12 nH, and 15 nH, respectively. The capacities of the capacitors 23, 25 and 27 are 3 pF, 3 pF, and 8 pF, respectively. In FIG. 6, reference character A designates the outer edge of a package.

Figure 7:
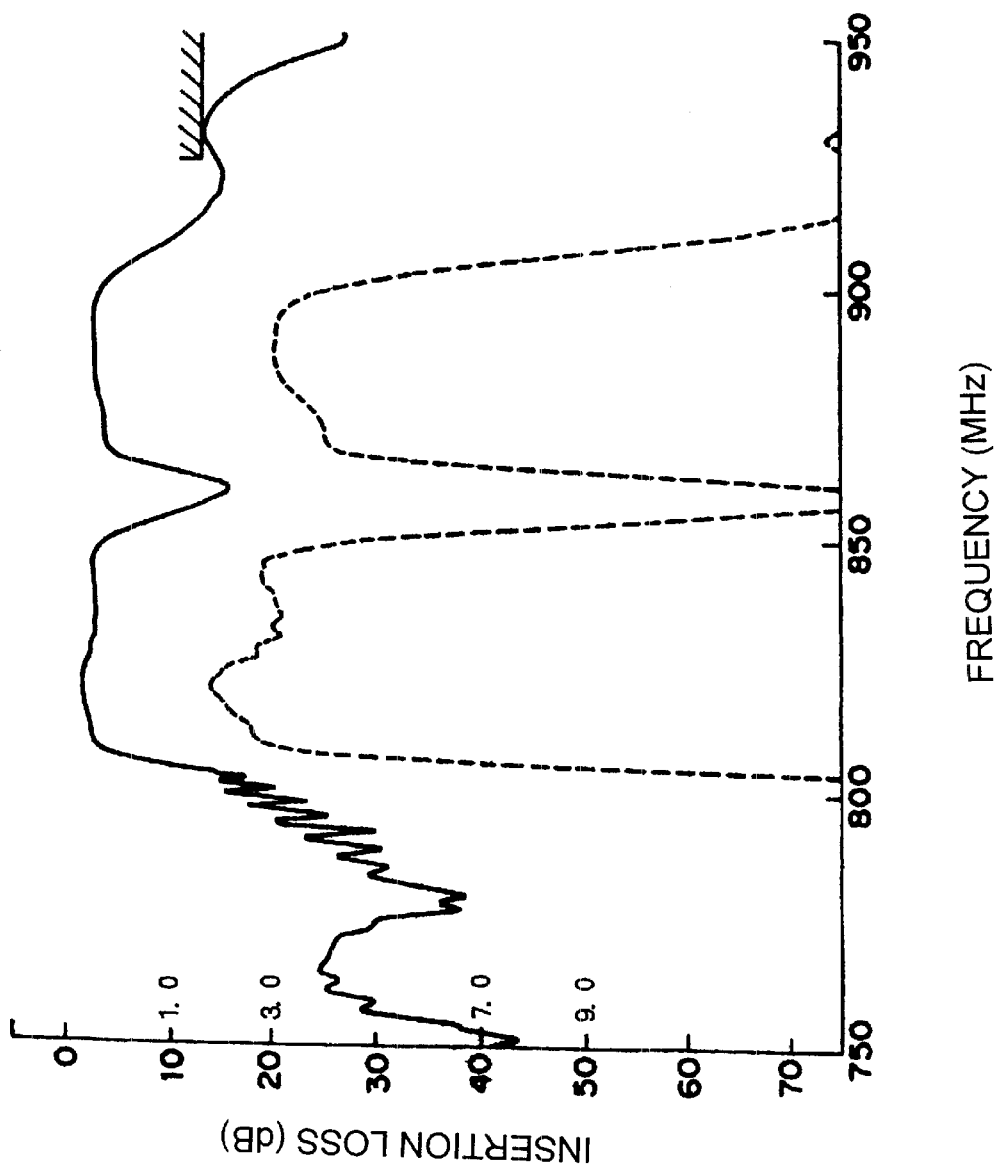
FIG. 7 is diagram illustrating the frequency characteristics of the conventional surface acoustic wave device shown in FIG. 6.

FIG. 7 illustrates the frequency characteristics of the comparative example of the surface acoustic wave device prepared as described above.

When comparing the surface acoustic wave device in accordance with the preferred embodiment with the above-described comparative example of the surface acoustic wave device, it is noted that the comparative example uses eight external elements while the surface acoustic wave device in accordance with the present preferred embodiment uses only two external elements. Hence, in the surface acoustic wave device in accordance with the present preferred embodiment, the overall mounting area is considerably smaller, although the surface acoustic wave device itself has a somewhat large size because of using one-port surface acoustic wave resonators 5, 6, and 9.

As is evident from the comparison between FIGS. 5 and 7, the attenuation value on the higher frequency side in the pass band is significantly increased as compared with the frequency characteristics of the surface acoustic wave device of the comparative example corresponding to the conventional example. When making a comparison at the attenuation value at 925 MHz to 960 MHz, it is recognized that the attenuation value for this preferred embodiment is 34 dB in contrast to 14 dB for the comparative example. That is, this preferred embodiment exhibits 20 dB of increase in the attenuation value over that of the comparative example.

In accordance with this preferred embodiment, therefore, the overall mounting area is greatly reduced, and further the attenuation value on the higher frequency side of the pass band is greatly increased.

Moreover, in this preferred embodiment, since one-port surface acoustic wave resonators 5 and 6 are inserted between surface acoustic wave filters 1 and 2 and the input terminal 3, respectively, the resistance against power is greatly improved.

One or two of one-port surface acoustic wave resonators 5, 6 and 9 may be omitted, and instead an unmatched impedance may be corrected by matching the impedance by utilizing inductance elements and capacitors as in the case of the comparative example. Even in this case, since at least one one-port surface acoustic wave resonator is disposed in a package, the mounting area can be reduced, and the attenuation value on the higher frequency side of the pass band can be made higher than the case of the comparative example.

In other words, in various preferred embodiments of the present invention, by connecting at least one one-port surface acoustic wave resonator in series between the surface acoustic wave filters 1 and 2 and the input terminal, or at at least one location between these surface acoustic wave filters and the output terminal, the attenuation value on the higher frequency side of the pass band can be made higher than the case where an impedance matching is performed using only inductance elements and capacitors or transmission lines.

Figure 8:
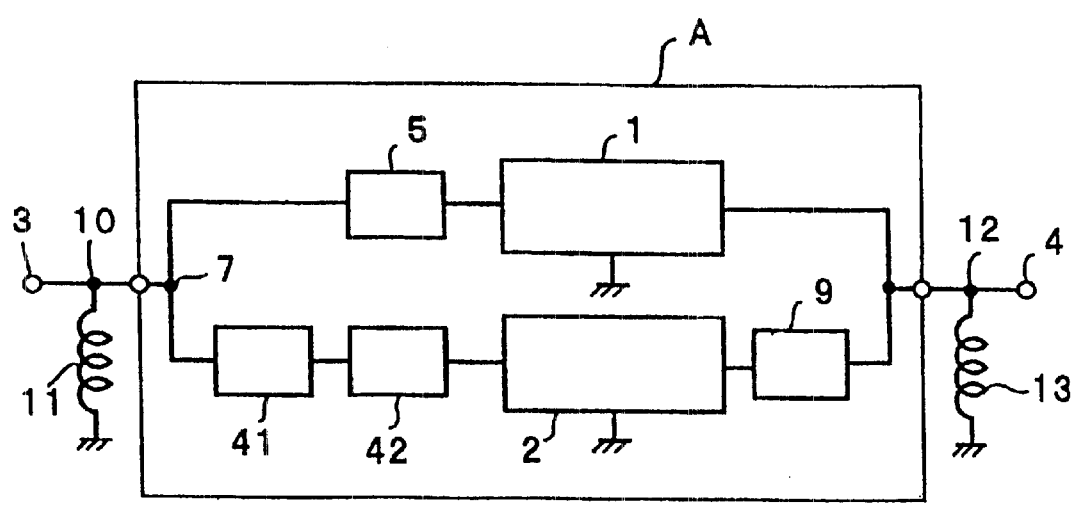
FIG. 8 is a diagram illustrating the circuit configuration of a surface acoustic wave device in accordance with a second preferred embodiment of the present invention.

FIG. 8 is a circuit diagram for explaining a surface acoustic wave device in accordance with a second preferred embodiment of the present invention.

The surface acoustic wave device in accordance with the second preferred embodiment is constructed similarly to the surface acoustic wave device in accordance with the first preferred embodiment except that two one-port surface acoustic wave resonators 41 and 42 are connected in series between a second surface acoustic wave filter 2 and the input terminal 3. Therefore, the same elements as those in the first preferred embodiment are identified by the same reference numbers, and particular descriptions will be omitted by utilizing the descriptions in the first preferred embodiment.

The total capacity of the one-port surface acoustic wave resonators 41 and 42 is arranged so as to be the same as the capacity of the one-port surface acoustic wave resonator 6 used in the first preferred embodiment. That is, the number of the IDT pairs of each of the one-port surface acoustic wave resonators 41 and 42 is one hundred. Each of the anti-resonance frequencies of the one-port surface acoustic wave resonators 41 and 42 is 922 MHz, which is the same as that of the one-port surface acoustic wave resonator 9.

Figure 9:
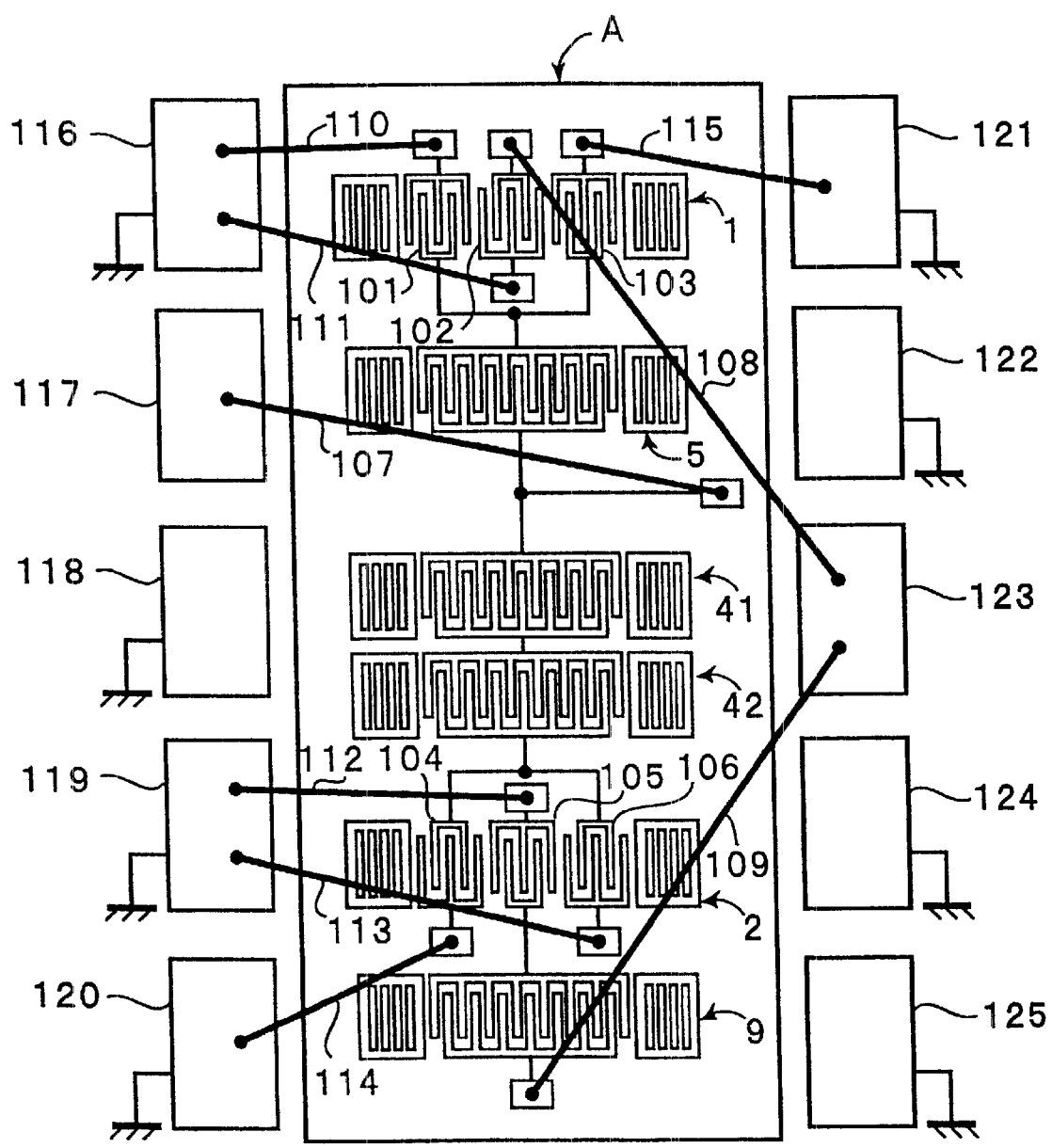
FIG. 9 is a plan view for explaining the specific structure of the second preferred embodiment shown in FIG. 8.

FIG. 9 is a schematic plan view illustrating details of the structure of the surface acoustic wave device in accordance with the second preferred embodiment shown in FIG. 8.

In the surface acoustic wave device shown in FIG. 9, a first surface acoustic wave filter 1 has three IDTs 101 through 103 disposed along the surface wave propagation direction, and a second surface acoustic wave filter 2 has three IDTs 104 through 106 disposed along the surface wave propagation direction. As is evident from FIG. 9, the input of the surface acoustic wave filters 1 and 2 is shared between these filters, on a piezoelectric substrate A, and is connected to an input terminal 117 provided on a package via a bonding wire 107.

The output sides of the first and second surface acoustic wave filters 1 and 2 are connected, in common, to an output terminal 123 provided on the package via a bonding wires 108 and 109, thereby sharing the output terminal 123 therebetween. Herein, reference numerals 110 through 115 designate bonding wires connected to the ground potential, and 116, 118 through 122, 124, and 125 designate ground terminals provided on the package.

In the second preferred embodiment shown in FIG. 9, the IDTs 101 and 103 of the first surface acoustic wave filter 1, and the IDTs 104 and 106 of the second surface acoustic wave filter 2, that is, IDTs disposed on both sides in the surface wave propagation direction, are connected to the input terminal. The center IDT 102 of the first surface acoustic wave filter 1, and the center IDT 105 and of the second surface acoustic wave filter 2 are connected to the output terminal.

Figure 10:
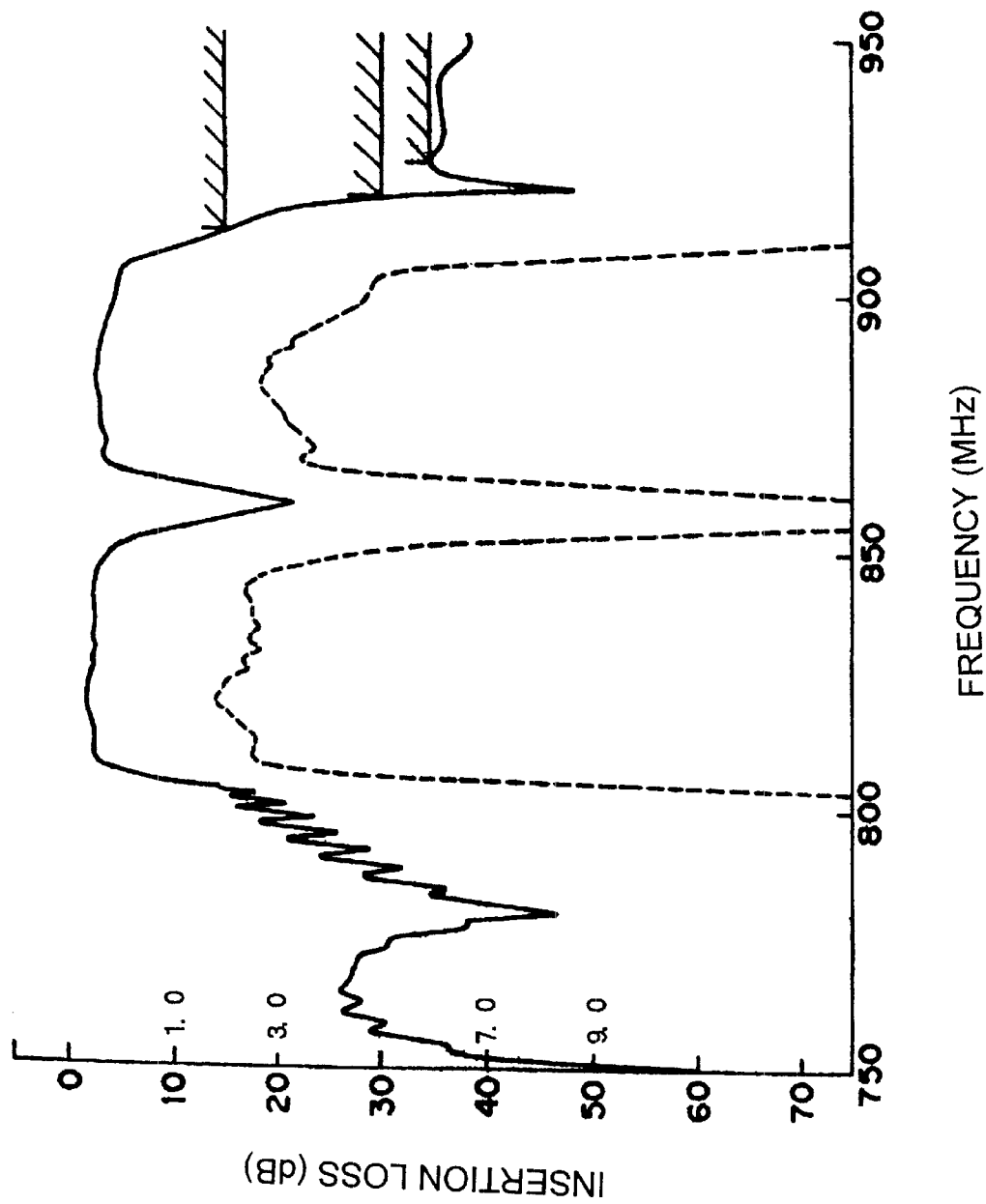
FIG. 10 is a diagram illustrating the frequency characteristics of the surface acoustic wave device in accordance with the second preferred embodiment of the present invention.

FIG. 10 illustrates the frequency characteristics of the surface acoustic wave device in accordance with the second preferred embodiment. As is obvious from the comparison between FIG. 10 and FIG. 5 that shows the frequency characteristics of the surface acoustic wave device in accordance with the first preferred embodiment, the characteristics of the first and second preferred embodiments in the vicinity of the pass band are substantially the same. The second preferred embodiment, however, achieves a higher attenuation value than the first preferred embodiment, on the higher frequency side of the pass band. Specifically, the attenuation value at 925 MHz to 960 MHz exhibits 1 dB of increase over the surface acoustic wave device in accordance with the first preferred embodiment.

Furthermore, by connecting a plurality of one-port surface acoustic wave resonators in a multi-stage series connection like the second preferred embodiment, the resistance against power can be even more improved than the surface acoustic wave device in accordance with the first preferred embodiment.

Next, a first modification of the second preferred embodiment will be described. The circuit configuration of this modification is similar to that of the second preferred embodiment. The only difference of the modification from the second preferred embodiment is that the frequencies determined by the electrode finger pitches of each of the IDTs of the one-port surface acoustic wave resonators 9, 41, and 42 are arranged so as to be different among these one-port surface acoustic wave resonators. Specifically, in the second preferred embodiment, the anti-resonance frequency of any of the one-port surface acoustic wave resonators 9, 41, and 42 is preferably about 922 MHz. In contrast, in this modification, the electrode finger pitches of each of the IDTs of the one-port surface acoustic wave resonators 9, 41, and 42 are preferably approximately 4.396 μm, 4.406 μm, and 4.399 μm, respectively, so that the anti-resonance frequencies of the one-port surface acoustic wave resonators 9, 41, and 42 become 926 MHz, 918 MHz, and 922 MHz, respectively.

Figure 11:
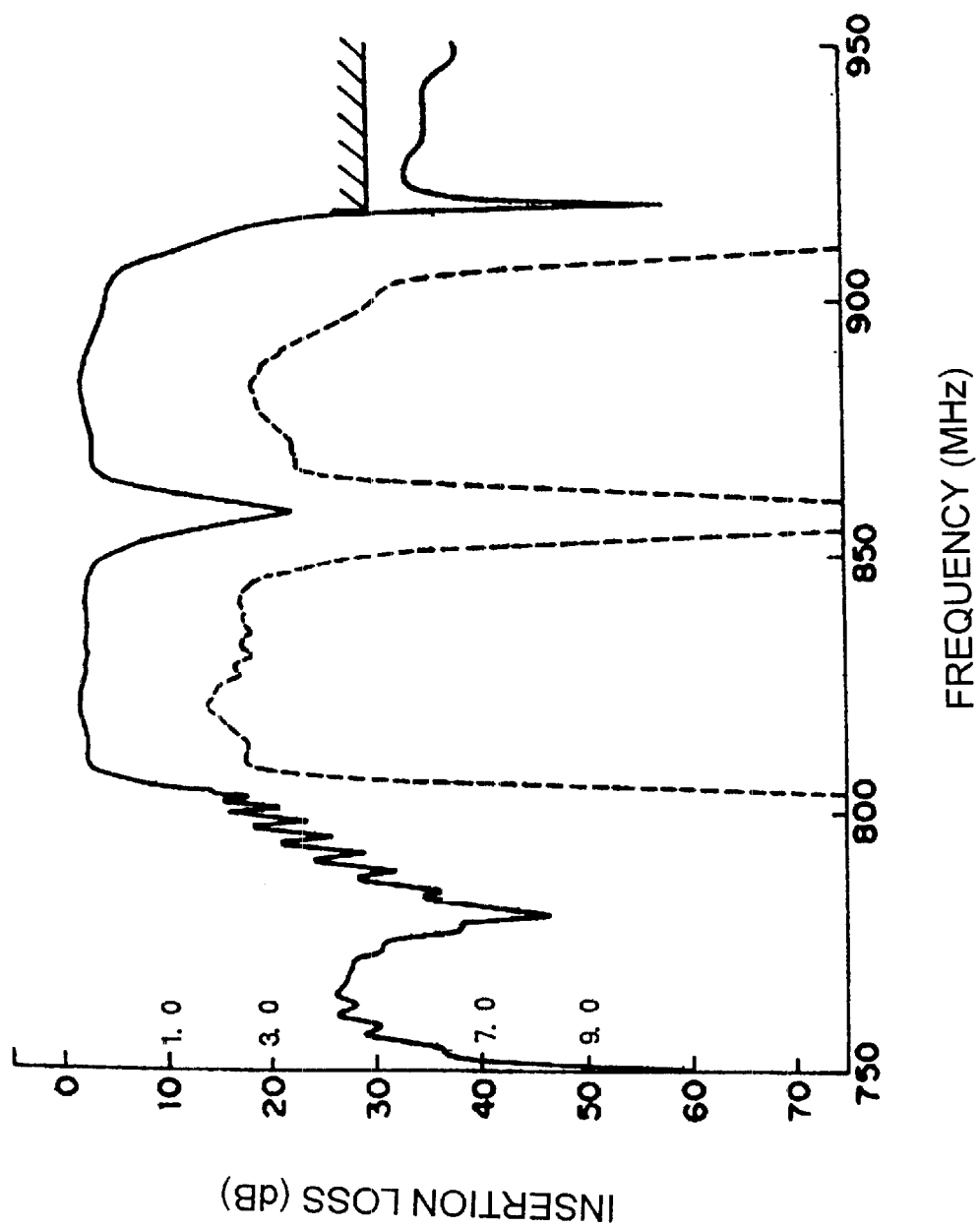
FIG. 11 is a diagram illustrating the frequency characteristics of a surface acoustic wave device in accordance with a first modification of the second preferred embodiment of the present invention.

FIG. 11 is illustrates the frequency characteristics of the surface acoustic wave device in accordance with this modification of preferred embodiments of the present invention. As is obvious from the comparison between FIG. 11 and FIG. 10, in accordance with this preferred embodiment, the steepness on the higher frequency side of the pass band is even more improved than the surface acoustic wave device in accordance with the second preferred embodiment. Specifically, in the second preferred embodiment, attenuation values not less than 30 dB are obtained in the frequency band not lower than 919 MHz, whereas attenuation values not less than 30 dB are obtained in the frequency band not lower than 916 MHz. This indicates that this modification allows higher attenuation values to be obtained over a wider frequency band.

Moreover, it is recognized that, in this modification, ripples in the pass band on the 870 MHz to 885 MHz band side are less than those in the case of the second preferred embodiment. This is because, by making the anti-resonance frequencies of one-port surface acoustic wave resonators 9, 41, and 42 differ from one another, small ripples occurring in the vicinities of the anti-resonance frequencies of one-port surface acoustic wave resonators cancel one another out.

Next, a second modification of the surface acoustic wave device in accordance with the second preferred embodiment will be described. The circuit configuration of the surface acoustic wave device in accordance with the second modification is similar to the second preferred embodiment.

In the second modification, each of the IDTs of the one-port surface acoustic wave resonators 9, 41, and 42 are preferably thinned out as follows. In an IDT, a plurality of electrode fingers which extend substantially perpendicular to the surface acoustic wave propagation direction are arranged along the surface acoustic wave propagation direction. For a normal type IDT, the plurality of the electrode fingers are consecutively connected to potentials which alternately differ. In this case, let the arrangement of two adjacent electrode fingers be expressed as "1", and let the arrangement wherein two adjacent electrode fingers are connected to the same potential by thinning out, be expressed as "0". When using such an expressing method, in this modification, the center portions in the surface acoustic wave propagation direction of IDTs are thinned out so as to be expressed as "1, 0, 0, 1, 0, 0, 1, 0, 0, 1, 0, 0, 1", the vicinities of both ends in the surface acoustic wave propagation direction are thinned out so as to be expressed as "1, 0, 0, 1, 0, 0, 1, 0 . . . ", and the portions between the center portions in the surface acoustic wave propagation direction and the end portions in the surface acoustic wave propagation direction are expressed as "1, 1, 1, 1 . . . ".

By thus thinning out the electrode fingers of each of the IDTs of the one-port surface acoustic wave resonators 9, 41, and 42, the anti-resonance frequencies approach the resonance frequency side. This allows a higher attenuation value to be achieved in the vicinity of the pass band. Herein, since the thinning out reduces the capacities of one-port surface acoustic wave resonators, the one-port surface acoustic wave resonators 9, 41, and 42, and the surface acoustic wave filters 1 and 2 are correspondingly designed so as to differ from those of the second preferred embodiment.

Figure 12:
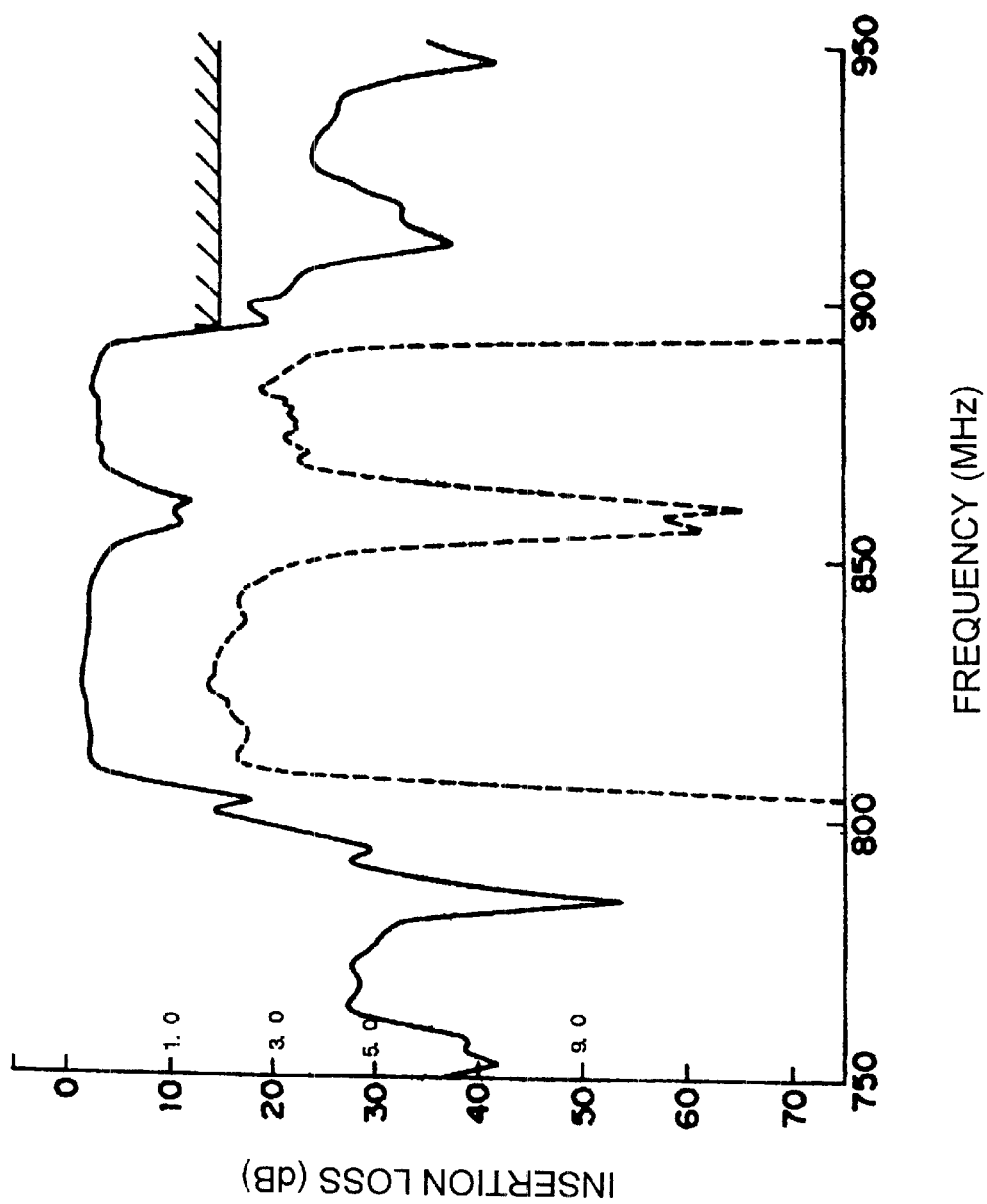
FIG. 12 is a diagram illustrating the frequency characteristics of a surface acoustic wave device in accordance with a second modification of the second preferred embodiment of the present invention.

FIG. 12 illustrates the frequency characteristics of a surface acoustic wave device in accordance with the second modification of preferred embodiments of the present invention. From the comparison between the frequency characteristics shown in FIG. 12 with the frequency characteristics of the surface acoustic wave device in accordance with the second preferred embodiment shown in FIG. 10, it is recognized that, this second modification is superior to the second preferred embodiment, in the steepness and attenuation characteristics in the higher frequency side of the pass band. When comparing the second modification with the second preferred embodiment in the frequency band where attenuation values not less than 15 dB are obtained, it is observed that, in the second preferred embodiment, attenuation values not less than 15 dB are obtained in the frequency band not lower than 911 MHz, whereas, in the second modification, attenuation values not less than 15 dB are obtained in the frequency band not lower than 892 MHz. This indicates that this modification allows higher attenuation values to be obtained over a wider frequency band. By the surface acoustic wave device in accordance with the second modification, therefore, a high attenuation value can be achieved even in the 893 MHz to 898 MHz frequency band.

Figure 13:
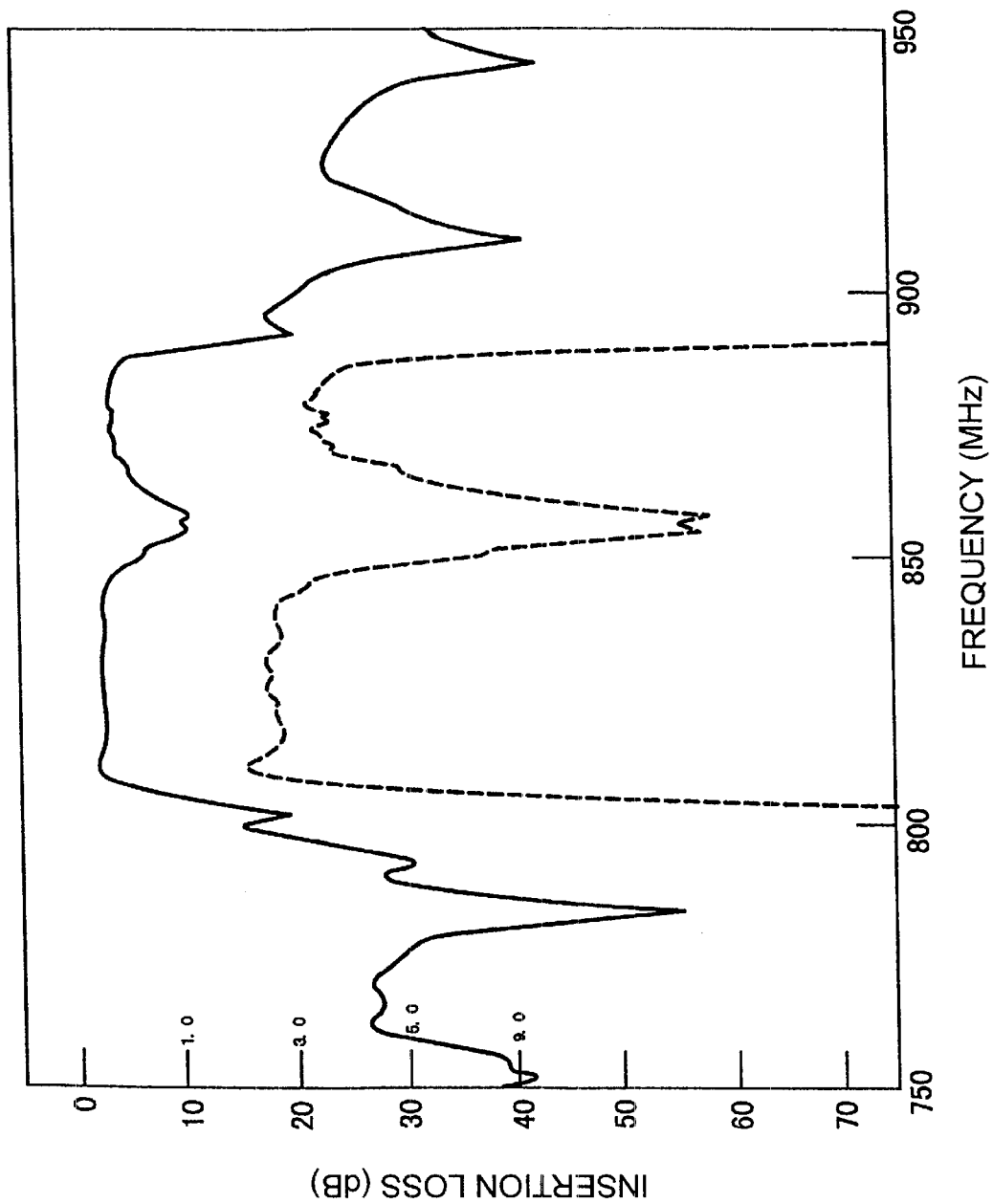
FIG. 13 is a diagram illustrating the frequency characteristics of the surface acoustic wave device shown in FIG. 9, wherein the IDTs on both sides in the surface wave propagation direction, of a first surface acoustic wave filter and the center IDT of a second surface acoustic wave filter are connected to an input end, and wherein the center IDT of the first surface acoustic wave filter and the IDTs on both sides in the surface wave propagation direction, of the second surface acoustic wave filter are connected to an output end.

FIG. 13 illustrates the frequency characteristics of the structure of the second preferred embodiment shown in FIG. 9, wherein the surface acoustic wave filters 1 and 2 are arranged similar to the above-described surface acoustic wave device in accordance with the above-described second modification, wherein the IDTs 101 and 103 of the surface acoustic wave filter 1 and the IDT 105 of the second surface acoustic wave filter 2 are connected to the input terminal, and wherein the IDT 102 of the first surface acoustic wave filter 1 and the IDTs 104 and 106 of the surface acoustic wave filters 2 are connected to the output terminal.

When comparing the frequency characteristics shown in FIG. 13 with those shown in FIG. 12, it is recognized that the frequency characteristics shown in FIG. 13 is inferior to those shown in FIG. 12, in the insertion loss in the pass band.

This implies that, when two longitudinally-coupled surface acoustic wave filters 1 and 2 are connected in parallel, it is preferable to connect the IDTs on both sides in the surface acoustic propagation direction, of these filters 1 and 2, in parallel with each other, and to connect the center IDTs of these filters 1 and 2 in parallel with each other.

Figure 14:
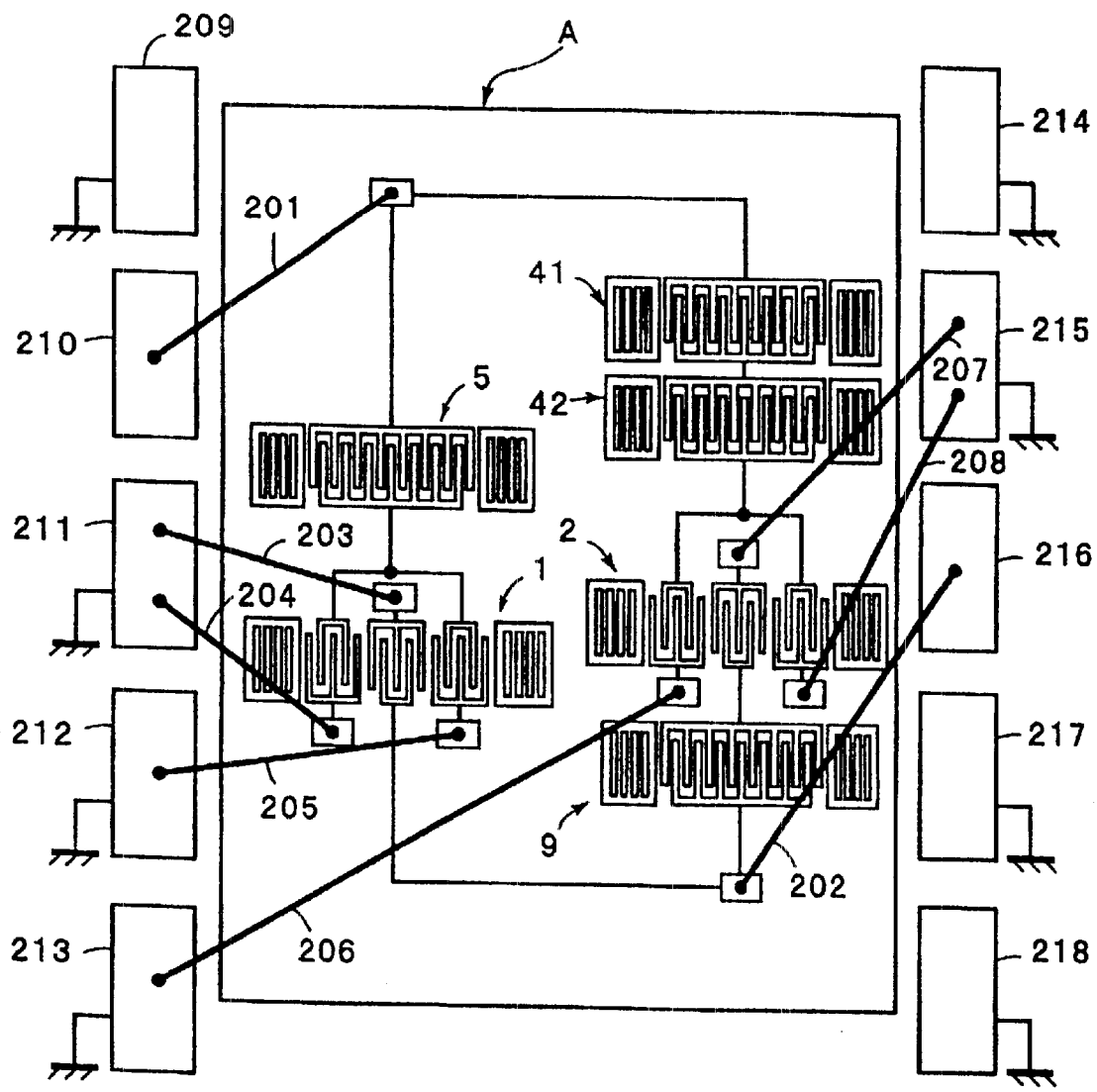
FIG. 14 is a schematic plan view for explaining a surface acoustic wave device in accordance with another modification of the second preferred embodiment of the present invention.

FIG. 14 illustrates another modification of the surface acoustic wave device in accordance with the second preferred embodiment shown in FIG. 9. In the surface acoustic wave device shown in FIG. 9, the output ends of the surface acoustic wave filters 1 and 2 are connected to the output terminal of the package in common via bonding wires, thereby sharing the output terminal therebetween, whereas, in the modification shown in FIG. 14, each of the input end side and output end side of the surface acoustic wave filters 1 and 2 is made usable in common on a piezoelectric substrate A.

The input ends of the surface acoustic wave filters 1 and 2 are connected to the input terminal 210 provided on the package via a bonding wire 201, and the output ends of the surface acoustic wave filters 1 and 2 are connected to the output terminal 216 provided on the package via a bonding wire 202. Herein, reference numerals 203 through 208 designate bonding wires connected to the ground potential, and 209, 211 through 215, 217, and 218 designate electrode pads which are provided on the package and connected to the ground potential.

By thus making each of the input end and the output end of the first and second surface acoustic wave filters 1 and 2 usable in common on a piezoelectric substrate A, electrical properties as a wafer can be checked via a probe. Furthermore, when the package is fixed and connected to the piezoelectric substrate via a face-down mounting method, the electrode design of the package side can be simplified, since each of the input end and the output end of the surface acoustic wave filters 1 and 2 is made usable in common on the piezoelectric substrate A.

Figure 15:
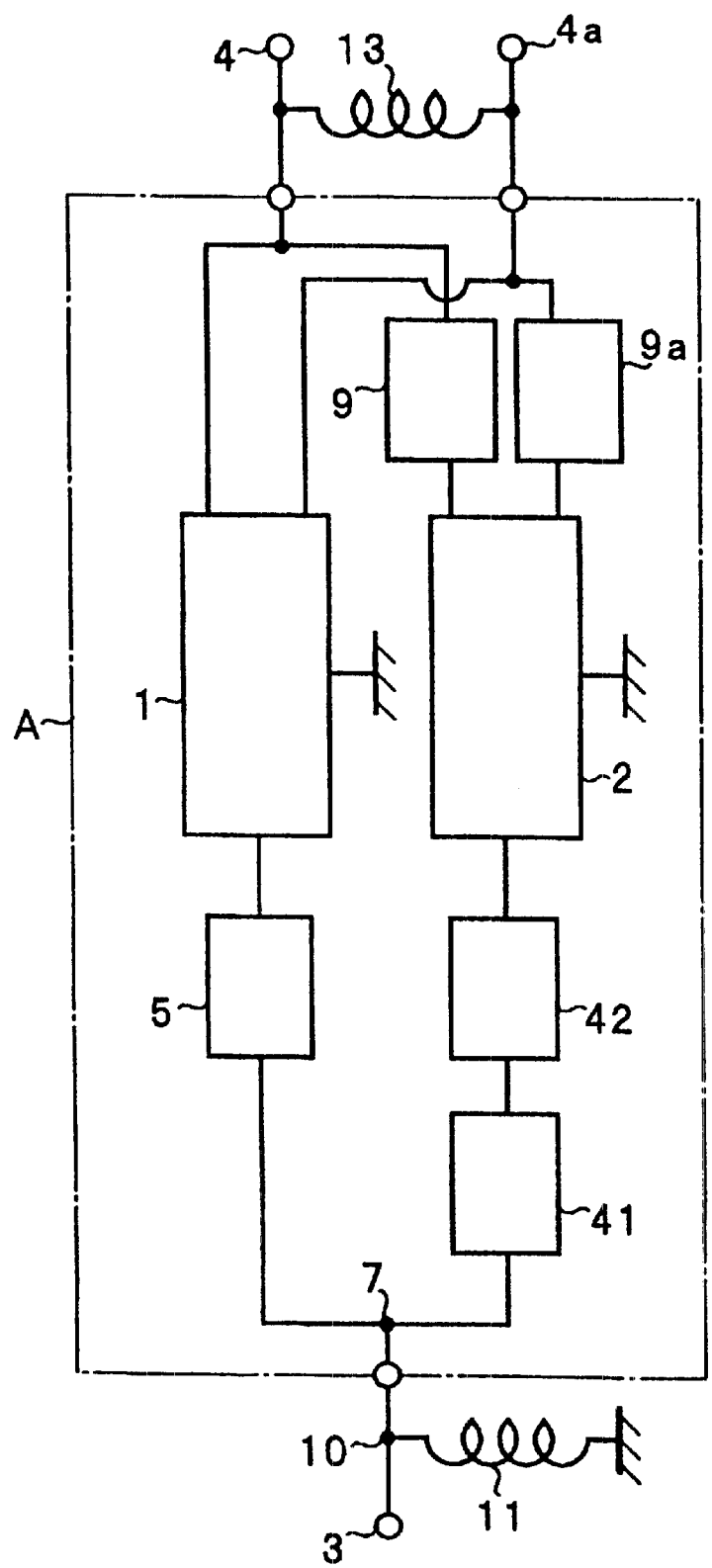
FIG. 15 is a schematic block diagram for explaining a surface acoustic wave device in accordance with still another modification of the second preferred embodiment of the present invention.

FIG. 15 is a block diagram illustrating still another modification of the second preferred embodiment shown in FIG. 8. Herein, the output terminal is preferably a balanced-signal terminal. Differences of this modification shown in FIG. 15 from the construction shown in FIG. 8 are that the cross width (aperture) of electrode fingers of the surface acoustic wave resonator 9 is preferably about half of that of the surface acoustic wave resonator 9 shown in FIG. 8, and that a surface acoustic wave resonator 9a having the same design is further connected. Two balanced-signal terminals of the surface acoustic wave filters 1 and 2 are connected to output terminals 4 and 4a, respectively, and an inductance 13 is connected in parallel across the output terminals 4 and 4a. By the construction shown in FIG. 15, a surface acoustic wave device which outputs the balanced-signal can be achieved. Contrary to this preferred embodiment, the input side may also be a balanced-signal terminal.

The surface acoustic wave device in accordance with preferred embodiments of the present invention is used for various band-pass filters. A communication device using the surface acoustic wave device in accordance with another preferred embodiment of the present invention as a band-pass filter will now be described with reference to FIG. 16.

Figure 16:
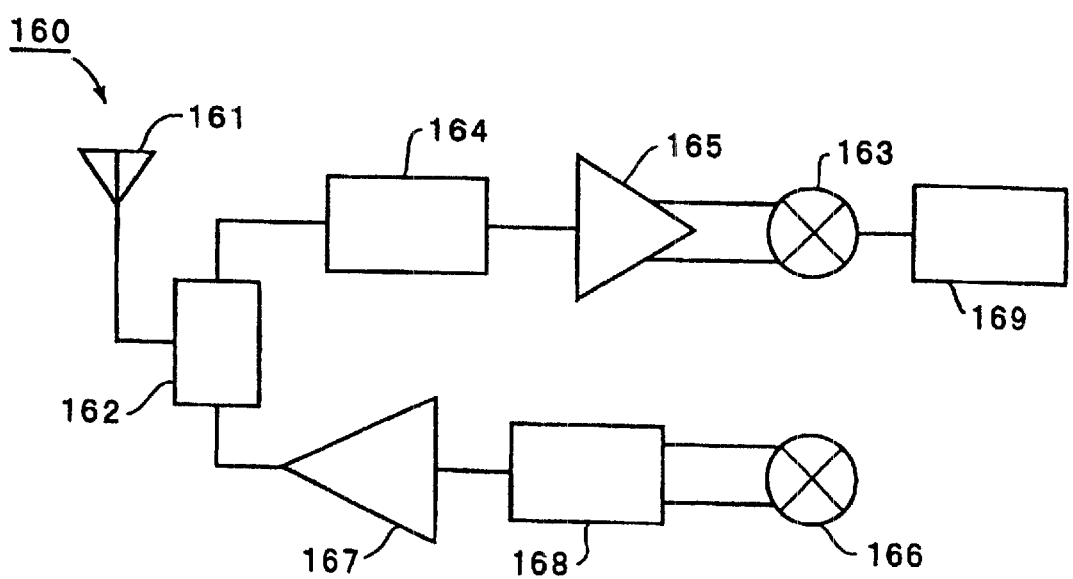
FIG. 16 is a schematic block diagram for explaining an example of a communication device using the surface acoustic wave device in accordance with another preferred embodiment of the present invention.
Figure 17:
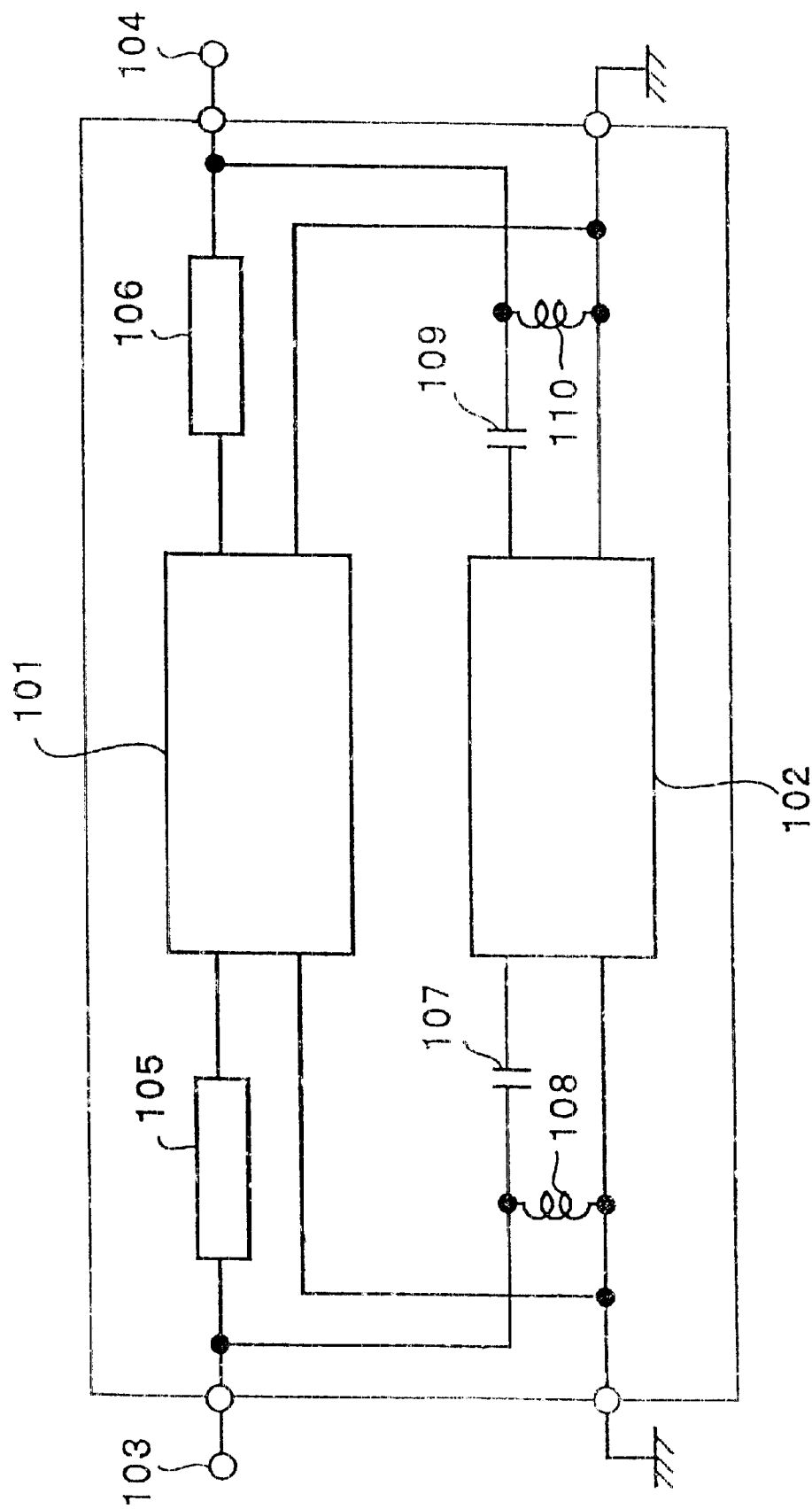
FIG. 17 is a diagram showing the circuit configuration of the conventional surface acoustic wave device.

In FIG. 16, a duplexer 162 is connected to an antenna 161. A surface acoustic wave filter 164 and an amplifier 165 which constitute an RF stage, are connected between the duplexer 162 and a reception-side mixer 163. A surface acoustic wave filter 169 which constitutes an IF stage is connected to the mixer 163. On the other hand, an amplifier 167 and a surface acoustic wave filter 168 which constitute an RF stage, are connected between the duplexer 162 and a transmission-side mixer 166.

The surface acoustic wave device constructed in accordance with preferred embodiments of the present invention can be suitably used as the RF-stage surface acoustic wave filter 164 or 168 in the above-described communication device 160.

While preferred embodiments of the present invention have been disclosed, various modes of carrying out the principles disclosed herein are contemplated as being within the scope of the following claims. Therefore, it is understood that the scope of the invention is not to be limited except as otherwise set forth in the claims.

What is claimed is:

1. A surface acoustic wave device comprising:
   a first surface acoustic wave filter connected between an input terminal and an output terminal;
   a second surface acoustic wave filter having a different center frequency than that of said first surface acoustic wave filter, and which is connected between said input terminal and said output terminal and in parallel with said first surface acoustic wave filter; and
   at least one one-port surface acoustic wave resonator connected in series with the first surface acoustic wave filter or the second surface acoustic wave filter, on at least one side between said input terminal and at least one of said first and second surface acoustic wave filters, or between said output terminal and at least one of said first and second surface acoustic wave filters; wherein
   the anti-resonance frequency of said one one-port surface acoustic wave resonator is positioned on the side of higher frequencies than those of the pass band of the surface acoustic wave filter disposed on the side where said one-port surface acoustic wave resonator is connected in series; and
   in at least one one-port surface acoustic wave resonator of said one-port surface acoustic wave resonators, the interdigital transducers are weighted.

2. A surface acoustic wave device as claimed in claim 1, wherein a plurality of said one-port surface acoustic wave resonators are connected in a multi-stage series connection.

3. A surface acoustic wave device as claimed in claim 1, wherein at least two of said one-port surface acoustic wave resonators are connected in series, on at least one side between said first or second surface acoustic wave filter and the input terminal, or between said first or second surface acoustic wave filter and the output terminal.

4. A surface acoustic wave device as claimed in claim 3, wherein said plurality of one-port surface acoustic wave resonators which are connected in series with each other, differ in the frequency determined by the pitch of the interdigital transducers thereof, from each other.

5. A surface acoustic wave device as claimed in claim 1, wherein each of said first and second surface acoustic wave filters is a longitudinally-coupled surface acoustic wave filter having three IDTs disposed along the surface wave propagation direction.

6. A surface acoustic wave device as claimed in claim 5, wherein in said first and second longitudinally-coupled surface acoustic wave filters each having three IDTs, the first and second longitudinally-coupled surface acoustic wave filters are connected in parallel with each other such that the outermost IDTs of said three IDT of said first and second longitudinally-coupled surface acoustic wave filters are connected to the input terminal, and such that the center IDTs of said first and second longitudinally-coupled surface acoustic wave filters are connected to the output terminal.

7. A surface acoustic wave device as claimed in claim 1, further comprising an inductance element additionally connected in parallel with each of said input and output terminals.

8. A surface acoustic wave device as claimed in claim 1, wherein said first surface acoustic wave filter and said second surface acoustic wave filter are connected in parallel with each other on a piezoelectric substrate.

9. A communication device comprising:
   a surface acoustic wave device as claimed in claim 1, defining a band-pass filter; and
   a mounting substrate mounting the surface acoustic wave device.

10. A surface acoustic wave device comprising:
    a first surface acoustic wave filter connected between an input terminal and an output terminal;
    a second surface acoustic wave filter having a different center frequency than that of said first surface acoustic wave filter, and which is connected between said input terminal and said output terminal and in parallel with said first surface acoustic wave filter;
    at least one one-port surface acoustic wave resonator connected in series with the first surface acoustic wave filter or the second surface acoustic wave filter, on at least one side between said input terminal and at least one of said first and second surface acoustic wave filters, or between said output terminal and at least one of said first and second surface acoustic wave filters; and
    an inductance element additionally connected in parallel with each of said input and output terminals; wherein
    the anti-resonance frequency of said one one-port surface acoustic wave resonator is positioned on the side of higher frequencies than those of the pass band of the surface acoustic wave filter disposed on the side where said one-port surface acoustic wave resonator is connected in series;
    the inductance value of the inductance element additionally connected in parallel with said input terminal differs from the inductance value of the inductance element additionally connected in parallel with said output terminal.

11. A surface acoustic wave device as claimed in claim 10, wherein each of said first and second surface acoustic wave filters is a longitudinally-coupled surface acoustic wave filter having three IDTs disposed along the surface wave propagation direction.

12. A surface acoustic wave device as claimed in claim 11, wherein in said first and second longitudinally-coupled surface acoustic wave filters each having three IDTs, the first and second longitudinally-coupled surface acoustic wave filters are connected in parallel with each other such that the outermost IDTs of said three IDTs of said first and second longitudinally-coupled surface acoustic wave filters are connected to the input terminal, and such that the center IDTs of said first and second longitudinally-coupled surface acoustic wave filters are connected to the output terminal.

13. A surface acoustic wave device as claimed in claim 10, wherein said first surface acoustic wave filter and said second surface acoustic wave filter are connected in parallel with each other on a piezoelectric substrate.

14. A surface acoustic wave device as claimed in claim 10, wherein a plurality of said one-port surface acoustic wave resonators are connected in a multi-stage series connection.

15. A surface acoustic wave device as claimed in claim 10, wherein at least two of said one-port surface acoustic wave resonators are connected in series, on at least one side between said first or second surface acoustic wave filter and the input terminal, or between said first or second surface acoustic wave filter and the output terminal.

16. A surface acoustic wave device as claimed in claim 15, wherein said plurality of one-port surface acoustic wave resonators which are connected in series with each other, differ in the frequency determined by the pitch of the interdigital transducers thereof, from each other.

17. A surface acoustic wave device comprising:
a first surface acoustic wave filter connected between an input terminal and an output terminal;
a second surface acoustic wave filter having a different center frequency than that of said first surface acoustic wave filter, and which is connected between said input terminal and said output terminal and in parallel with said first surface acoustic wave filter; and
at least one one-port surface acoustic wave resonator connected in series with the first surface acoustic wave filter or the second surface acoustic wave filter, on at least one side between said input terminal and at least one of said first and second surface acoustic wave filters, or between said output terminal and at least one of said first and second surface acoustic wave filters; wherein
the anti-resonance frequency of said one one-port surface acoustic wave resonator is positioned on the side of higher frequencies than those of the pass band of the surface acoustic wave filter disposed on the side where said one-port surface acoustic wave resonator is connected in series; and
the electrode film thickness of said first surface acoustic wave filter differs from that of said second surface acoustic wave filter.

18. A surface acoustic wave device as claimed in claim 17, wherein each of said first and second surface acoustic wave filters is a longitudinally-coupled surface acoustic wave filter having three IDTs disposed along the surface wave propagation direction.

19. A surface acoustic wave device as claimed in claim 18, wherein in said first and second longitudinally-coupled surface acoustic wave filters each having three IDTs, the first and second longitudinally-coupled surface acoustic wave filters are connected in parallel with each other such that the outermost IDTs of said three IDTs of said first and second longitudinally-coupled surface acoustic wave filters are connected to the input terminal, and such that the center IDTs of said first and second longitudinally-coupled surface acoustic wave filters are connected to the output terminal.

20. A surface acoustic wave device as claimed in claim 17, further comprising an inductance element additionally connected in parallel with each of said input and output terminals.

21. A surface acoustic wave device as claimed in claim 17, wherein said first surface acoustic wave filter and said second surface acoustic wave filter are connected in parallel with each other on a piezoelectric substrate.

22. A surface acoustic wave device as claimed in claim 17, wherein a plurality of said one-port surface acoustic wave resonators are connected in a multi-stage series connection.

23. A surface acoustic wave device as claimed in claim 17, wherein at least two of said one-port surface acoustic wave resonators are connected in series, on at least one side between said first or second surface acoustic wave filter and the input terminal, or between said first or second surface acoustic wave filter and the output terminal.

24. A surface acoustic wave device as claimed in claim 23, wherein said plurality of one-port surface acoustic wave resonators which are connected in series with each other, differ in the frequency determined by the pitch of the interdigital transducers thereof, from each other.

25. A surface acoustic wave device comprising:
a first surface acoustic wave filter connected between an input terminal and an output terminal;
a second surface acoustic wave filter having a different center frequency than that of said first surface acoustic wave filter, and which is connected between said input terminal and said output terminal and in parallel with said first surface acoustic wave filter; and
at least one one-port surface acoustic wave resonator connected in series with the first surface acoustic wave filter or the second surface acoustic wave filter, on at least one side between said input terminal and at least one of said first and second surface acoustic wave filters, or between said output terminal and at least one of said first and second surface acoustic wave filters; wherein
the anti-resonance frequency of said one one-port surface acoustic wave resonator is positioned on the side of higher frequencies than those of the pass band of the surface acoustic wave filter disposed on the side where said one-port surface acoustic wave resonator is connected in series; and
at least one of said input terminal and said output terminal are balanced-signal terminals.

26. A surface acoustic wave device as claimed in claim 25, wherein each of said first and second surface acoustic wave filters is a longitudinally-coupled surface acoustic wave filter having three IDTs disposed along the surface wave propagation direction.

27. A surface acoustic wave device as claimed in claim 26, wherein in said first and second longitudinally-coupled surface acoustic wave filters each having three IDTs, the first and second longitudinally-coupled surface acoustic wave filters are connected in parallel with each other such that the outermost IDTs of said three IDTs of said first and second longitudinally-coupled surface acoustic wave filters are connected to the input terminal, and such that the center IDTs of said first and second longitudinally-coupled surface acoustic wave filters are connected to the output terminal.

28. A surface acoustic wave device as claimed in claim 25, further comprising an inductance element additionally connected in parallel with each of said input and output terminals.

29. A surface acoustic wave device as claimed in claim 25, wherein said first surface acoustic wave filter and said second surface acoustic wave filter are connected in parallel with each other on a piezoelectric substrate.

30. A surface acoustic wave device as claimed in claim 25, wherein a plurality of said one-port surface acoustic wave resonators are connected in a multi-series connection.

31. A surface acoustic wave device as claimed in claim 25, wherein at least two of said one-port surface acoustic wave resonators are connected in series, on at least one side between said first or second surface acoustic wave filter and the input terminal, or between said first or second surface acoustic wave filter and the output terminal.

32. A surface acoustic wave device as claimed in claim 31, wherein said plurality of one-port surface acoustic wave resonators which are connected in series with each other, differ in the frequency determined by the pitch of the interdigital transducers thereof, from each other.

* * * * *